(12) United States Patent
Lan

(10) Patent No.: US 10,725,101 B2
(45) Date of Patent: Jul. 28, 2020

(54) ADDRESSABLE TEST CHIP WITH MULTIPLE-STAGE TRANSMISSION GATES

(71) Applicant: Semitronix Corporation, Hangzhou (CN)

(72) Inventor: Fan Lan, Hangzhou (CN)

(73) Assignee: Semitronix Corporation, Hangzhou (CN)

(*) Notice: Subject to any disclaimer, the term of this patent is extended or adjusted under 35 U.S.C. 154(b) by 0 days.

(21) Appl. No.: 16/377,422

(22) Filed: Apr. 8, 2019

(65) Prior Publication Data

US 2019/0235021 A1 Aug. 1, 2019

Related U.S. Application Data

(63) Continuation of application No. 15/859,306, filed on Dec. 29, 2017, now Pat. No. 10,254,339.

(30) Foreign Application Priority Data

Dec. 30, 2016 (CN) .......................... 2016 1 1260100
Dec. 29, 2018 (CN) ..................... 2018 2 2250453 U
Dec. 29, 2018 (CN) ..................... 2018 2 2254087 U
Mar. 22, 2019 (CN) ..................... 2019 2 0376170 U

(51) Int. Cl.
*G01R 31/317* (2006.01)
*G01R 31/28* (2006.01)

(52) U.S. Cl.
CPC ... *G01R 31/31722* (2013.01); *G01R 31/2882* (2013.01); *G01R 31/2886* (2013.01)

(58) Field of Classification Search
CPC ............ G01R 31/2882; G01R 31/2886; G01R 31/2879
See application file for complete search history.

(56) References Cited

U.S. PATENT DOCUMENTS

| | | | | |
|---|---|---|---|---|
| 7,859,285 B2* | 12/2010 | Sheu | .................. | G01R 31/2884 324/750.3 |
| 9,646,900 B2* | 5/2017 | Ouyang | .................. | H01L 22/14 |
| 2005/0085032 A1* | 4/2005 | Aghababazadeh | .......................... | G01R 31/2831 438/232 |
| 2008/0175080 A1* | 7/2008 | Kim | ............... | G01R 31/318511 365/201 |
| 2013/0229068 A1* | 9/2013 | Sanders, III | ......... | H01H 47/002 307/115 |

\* cited by examiner

*Primary Examiner* — Alvaro E Fortich
(74) *Attorney, Agent, or Firm* — Syncoda LLC; Feng Ma

(57) ABSTRACT

A test apparatus for testing electrical parameters of a target chip, the apparatus including: a function generator; a switch matrix module; a plurality of source measurement units (SMUs); at least one of the SMUs is configured to provide power supply for the target chip; at least one of the SMUs is coupled to the switch matrix module; and at least two of said SMUs are test SMUs coupled to ports of the target chip and the function generator.

20 Claims, 21 Drawing Sheets ically, and each process has a specific process deviation, which resulting in the yield reduction of IC chips. In the background of manufacturability, test chip is used to monitor and improve the yield of IC manufacture effectively, it is very effective to obtain the necessary data of manufacturing process and yield improvement through testing test chip.

ADDRESSABLE TEST CHIP WITH MULTIPLE-STAGE TRANSMISSION GATES

CROSS-REFERENCE TO RELATED APPLICATIONS

The present application is a continuation of, and claims priority to, U.S. patent application Ser. No. 15/859,306 filed on Dec. 29, 2017, which claims priority to Chinese Patent Application No. CN 201611260100.3 filed on Dec. 30, 2016. The present application also claims priority to Chinese Patent Application Nos. CN 201822254087.1 filed on Dec. 29, 2018, CN 201822250453.6 filed on Dec. 29, 2018 and CN 201920376170.8 filed on Mar. 22, 2019. The disclosures of these applications are hereby incorporated by reference in their entirety.

BACKGROUND

As the design scale of integrated circuits (IC) continues to expand, the density of electronic devices on a single chip is growing, and the characteristic dimension of electronic devices is diminishing. As we all know, the IC process flow contains many complex processes, and each process has a specific process deviation, which resulting in the yield reduction of IC chips. In the background of manufacturability, test chip is used to monitor and improve the yield of IC manufacture effectively, it is very effective to obtain the necessary data of manufacturing process and yield improvement through testing test chip.

Short-ranged test chip and addressable test chip are two types of the test chips frequently used in the manufacture of IC. Short-ranged test chip has been widely used because of its short production cycle, flexible test and high accuracy. However, in the traditional short-ranged test chip, each device under to test (DUT) needs to be connected to two or more pads, therefore, the disadvantage of short-ranged test chip is very obvious: low utilization rate of area. The addressable test chip uses decoders and the switching circuit to achieve the purpose of sharing pads between DUTs, but the type of test chip requires more complicated peripheral circuit. The simplification for the peripheral circuit for the addressable test chip has become the main problem to limit the wide application of the addressable test chip. A technical improvement about this problem has been mentioned in CN patent applications ZL201010612475.8, ZL 201520437526.6 etc.

SUMMARY

The inventors of the present disclosure have recognized that, although the abovementioned technical improvements on the peripheral circuit are successful, the number of DUTs is increased greatly in comparison with short-range test chip and addressable test chip with complicated peripheral circuit, which will lead to the test cycle growth correspondingly, and long periods of testing cannot meet advanced technology nodes' (such as 14 nm, 10 nm, or 7 nm) requirement; on the other hand, the DUT density of existing addressable test chip is less than 1000/mm$^2$, the advanced technology nodes needs more high density to improve the failure detection rate and save the cost of manufacturing area.

To solve the technical problem of long test periods of addressable test chips in existing technology, this disclosure provides a test system that meets the requirements of testing addressable test chip under the advanced technology, which can improve the test efficiency effectively and provide different test modes according to user's needs. Moreover, the disclosure also discloses a new type of address register; a new type of high density addressable test chip, which can accommodate DUTs more than 1000/mm$^2$ and increase the accuracy of measurement.

An addressable test chip test system includes a test apparatus, a probe card and an addressable test chip, the test apparatus connects to the addressable test chip through the probe card to constitute a test path. An address register is integrated in the probe card or the addressable test chip.

The address register includes a plurality of edge-triggered flip-flop registers, at least one counter logic, at least one shifter logic and a multiplexer; the input ports include a reset signal RST, a clock signal CLK, a shift enable signal SE, a shift data input signal SI, the outputs port is an address signal ADDR. The internal connection of the address register is as follows: the input D of edge-triggered flip-flop registers connected to the data output of the multiplexer, the input R of edge-triggered flip-flop registers connected to RST of address register, the input CK of edge-triggered flip-flop registers connected to CLK of address register, the output Q of edge-triggered flip-flop registers connected to ADDR of address register; the input of the counter logic is connected to ADDR of address register; the input of the shifter logic connected to ADDR and SI; the input of the multiplexer connected to SE, the output of the counter logic and the shifter logic. The shift enable signal SE controls multiplexer, the signal chooses one device to work between the counter logic and the shifter logic. When SE=1, the shifter logic is selected, each time the edge of the clock signal is changed, the address signal shifts 1 bit to right, the lowest bit is discarded, the highest bit is changed to SI; any address signal can be inputted from the outside through this mode. When SE=0, the counter logic is selected, if the CLK signal is running, each time the edge of the clock signal is changed, the address signal ADDR can be changed to ADDR+1, the address signal can realize increase in sequence through this mode; if CLK signal is stopped, the address signal ADDR is unchanged, and the address signal can be changed through the above mode of SE=1.

In some embodiments, the address register also includes a scan data output signal (SO) output port, which outputs the lowest bit of the address signal which is used to check whether DUT is the one we want to test.

The addressable test chip is a circuit design technology which combines the addressing circuit with the test chip technology. Common addressable test chip includes a plurality of pads, addressing circuit, switching circuit and DUTs. The addressing circuit connects to address signal pads and obtains address signal through the address signal pads, the addressing circuit also connects to the switching circuit and outputs address select signals to control switches of the switching circuit in on-state or off-state; the switching circuit connects to DUTs and selects a single DUT to be tested through the switch state; the addressing circuit also connects to the power pads and the power pads supply power for the whole test chip, the switching circuit also connects to test pads through signal lines and the test pads supply test points for the whole test chip.

The switching circuit can be composed by common switches or transmission gates, the transmission gate often used as switch due to smaller resistance compared with common switch. The requirement of testing accuracy becomes higher and higher with the progress of integrated circuit process, the background leakage of transmission gate cannot be ignored while high test accuracy requirement.

In some embodiments, the switching circuit includes a multi-stage transmission gate circuit having multiple transmission gate structures; each stage of the circuit includes at least one transmission gate structure; each transmission gate structure includes at least one transmission gate; the output end of each high-level transmission gate is coupled to low-level transmission gate(s)' input ends of a low-level transmission gate structure, the output ends of the lowest level transmission gates are coupled to terminals of DUTs, the input ends of the highest level transmission gate are coupled to test pads; the input end of each transmission gate can also be connected to the decoder in the addressing circuit.

In some embodiments, for multi-stage transmission gate structures, each same-level transmission gate connected to the same number of low-level transmission gates to ensure the same test accuracy of each DUT.

In some embodiments, the input ends of the same-level transmission gates are connected with the same decoder.

The multi-stage transmission gate circuit is used in the addressable test chip as switching circuit, which can reduce leakage current effectively. Therefore, the electrical parameters of chips can be tested accurately.

The switching circuit as a part of addressable test chip, whether using common switches, transmission gates, or multi-stage transmission gate structures, the IR-drop of switching circuit cannot be ignored in some testing requirement, such as small resistance measurement. To solve this problem, in some embodiments, a couple of forcing circuit and sensing circuit are configured to each DUT array in the addressable test chip.

Defining a forcing circuit includes an addressing circuit and a switching circuit, defining a sensing circuit includes an addressing circuit and a switching circuit. The addressable test chip is configured with forcing circuit and sensing circuit includes a plurality of pads, at least one forcing circuit, at least one sensing circuit and DUTs. The DUTs can be divided into one or more DUT arrays, a couple of forcing circuit and sensing circuit are configured to each DUT array, one addressing circuit can be shared by a couple of forcing circuit and sensing circuit; each forcing circuit includes a force addressing circuit and a force switching circuit, each sensing circuit includes a sense addressing circuit and a sense switching circuit; for each DUT array, the force addressing circuit and sense addressing circuit connect to address signal pads and obtain address signal through the address signal pads, and also connect to the force switching circuit and sense switching circuit respectively, and output address select signals to control switches of the force switching circuit and sense switching circuit in on-state or off-state; the force and sense switching circuits connect to DUTs and select a same DUT to be tested through the state of switches. The force addressing circuit and sense addressing circuit also connect to the power pads and the power pads supply power for the whole test chip, the force and sense switching circuits also connect to test pads and the test pads supply test points for the whole test chip.

The test apparatus includes a function generator, a switch matrix module, several source measurement units (SMUs) and at least a database; at least one SMU is configured to provide power supply for the test object (chip to be tested); at least one SMU is connected to the switch matrix module; at least one SMU is used to connect the address register; some SMUs are test SMUs, these test SMUs connect to the ports of DUTs to realize electrical test, and these test SMUs also connect to the function generator; the database used to store test results.

In some embodiments, all the SMUs in test apparatus are connected to the probe card through the switch matrix module.

The addressable test chip test system of the disclosure includes the aforementioned test apparatus, a probe card and an addressable test chip, and the aforementioned new type of address register is integrated in the probe card or the addressable test chip. The structure of the test system is as follows: the address registers connected to the addressing circuits in the addressable test chips; at least one SMU in the test apparatus connects to the power pads in the addressable test chip through the probe card, and provides power to the test chip in the test apparatus; at least one SMU connected to the switch matrix module, and the switch matrix module connected to the address register; the function generator and at least one SMU are respectively connected to the address register; at least two SMUs are test SMUs, and the test SMUs connected to the switching circuit of the test chip through the probe card, so as to provide voltage and realize data test; the function generator also connected to these test SMUs.

In some embodiments, the buffers are configured to the address circuit to solve the problem of too long metal wiring connection and signal integrity.

In some embodiments, a buffer is configured in the test apparatus or the probe card of the test system, and the function generator doesn't connect directly with the test SMUs, but is connected to the test SMUs through the buffer.

In some embodiments, more SMUs are configured to keep the test system more stable, two or more SMUs are required to supply power; sometimes, when the parallel testing is needed, several DUTs need to be test simultaneously, one test results output terminal needs to be configured as one SMU.

Before the test system is tested, the test apparatus is configured to connect with the probe card; in response to the test requirement, the test apparatus controls the probe card to connect with the addressable test chip; the function generator generates clock pulse signals, the clock pulse signal stimulates the address register to generate address signals, the address signal is decoded to address select signals through addressing circuit in the addressable test chip, the address select signal controls switching circuit to select a DUT to be tested, at the same time, the clock pulse signal generated by the function generator is output into the test SMUs in the test apparatus to trigger the test apparatus to enter test state; therefore, the test apparatus will test the selected DUT immediately when the DUT is selected.

Based on the function of the address register, when the shift enable signal SE=1, the shifter logic in the address register is selected, and the address register has the same function of a shift register, the test chip entries the address configuration mode: each time the edge of the clock signal is changed, the address register 1) shifts all address bits right 1 bit, 2) reads the shift data input SI into the highest address bit, and 3) the lowest address bit is discarded. After all address bits have been shifted in, the address register is configured to the desired address. When the shift enable signal SE=0, the counter logic in the address register is selected, and the address register has the same function of a counter, the test chip entries either the sequential test mode if the clock signal is running, or the diagnostic test mode if the clock signal is stopped. In the sequential test mode, each time the edge of the clock signal is changed, the address is transformed to the next address (address+1), and the corresponding DUT is tested by the test apparatus; as the clock pulse keeps running, all DUTs will be successively tested by the test apparatus. In the diagnostic test mode, the clock signal is stopped, thus the selected DUT will not be changed, the selected DUT can be diagnosed by adjusting the voltages of its terminals, e. g. plot the Id-Vg curve of a transistor DUT, by changing the voltage on gate terminal; if the other DUTs need to be tested, reconfigured the address to select a DUT to test every time.

The addressable test chip test system according to some embodiments executes address configuration mode as follows:

A1, power on the test system;
A2, configure the SMUs and the function generator;
A3, set the reset signal RST=1 and maintain more than 100 μs, then turn the reset signal RST=0;
A4, set the shift enable signal SE=1, the test chip entries the address configuration mode;
A5, the variable i is assigned to the address data bit N, the shift data input signal SI is assigned to the i-th of the address data bit;
A6, maintain more than 10 μs;
A7, the function generator produces a complete pulse;
A8, the variable i is assigned to i−1; if i=0, end the address configuration, otherwise, go back to step A5.

After the address configuration is complete, take DUTs being transistors as an example, the addressable test chip test system executes sequential test mode as follows:

B1, configure the SMUs and the function generator;
B2, set the address range of the DUTs from StartAddr to EndAddr, the number of the DUT is N, M measurement items need to be tested for each DUT, and each measurement items corresponds to a different voltage/current combination of the signal line ports connected to DUTs (in some embodiments, a transistor is connected to signal lines GF, GL, DF, DL, SF, SL, BF);
B3, each measurement items of the M measurement items is labeled as Mi (i is an integer from 1 to M), execute steps from B5 to B11;
B4 set the address data as StarAddr;
B5, execute steps from A4 to A8, complete the address configuration for sequential test mode;
B6, set SE=0;
B7, set the function generator to produce a continuous pulse (square wave), and set a needed frequency and set the number of pulses as N;
B8, start function generator, during each pulse time, the addressable test chip completes an address transformation, the test SMU will complete a test, and the test results are stored into test SMUs momentarily;
B9, every SamplePerFetch pulses, reads the test results from test SMU, fetches and stores the data into the database;
B10, finish the test until all the N pulses are generated, and all the test results are stored in the database.

Wherein, StartADDR, EndADDR and SamplePerFetch are integers, and EndADD≥StartADDR; in some embodiments, the DUT is a MOS transistor, GF, GL, DF, DL, SF, SL, BF are signal lines connected to the ports of DUT, and GF, GL, DF, DL, SF, SL, BF pads are test pads. GF and GL pads are pads connected to the gate end of DUT, DF and DL pads are pads connected to the drain end of DUT, SF and SL are pads connected to the source end of DUT, and BF pad is a pad connected to the substrate end of DUT.

After the address configuration is complete, the addressable test chip test system executes diagnostic test mode as follows:

C1, configure the SMUs and the function generator;
C2, set the address, named Addr, of the DUT to be diagnosed;
C3, set the address data as Addr;
C4, execute steps from A4 to A8, complete the address configuration;
C5, set SE=0;
C6, adjust the voltages/current on test pads, and measure accordingly for diagnosis;
C7, go back to step C3 if another DUT needs to be diagnosed.

In some embodiments, the address register is integrated in a common addressable test chip, which constitutes a new type of addressable test chip. The input end of the address register connected to address register pads in the test chip; the output end of the addressing circuit connected to the first port of the switching circuit, the second and third port of the switching circuit connected to DUTs and test pads through signal lines. The address register outputs address signals, these address signals are decoded by the addressing circuit as address select signals, these address select signals control switching circuit to select DUT to be test. For the common addressable test chip, the inputs end of addressing circuit are connected to the address pads; if the number of DUT is N, this means that N address select signals are required; according to the principle of digital circuit, $\log_2 N$ address signals are required to generate N address select signals, therefore, $\log_2 N$ address signal pads are also required. As the development of the IC in high integration degree and high manufacturing area utilization ratio, more and higher density DUTs are fabricated in one test chip, but more DUTs means more address signal pads, the area of a pad is much bigger that a DUT in test chip, more address signal pads must limit the number of DUT. Integrating a new type of address register provided by the disclosure into the common addressable test chip only requires at least four address register pads (SE, SI, RST, CLK) to replace the $\log_2 N$ address signal pads, this method greatly reduces the area of the pad in the addressable test chip and expands the capacity of the DUT. In some embodiments, $10^6$ DUTs can be accommodated in 10 mm$^2$ area.

The addressable test chip test system according to some embodiments includes a test apparatus, a probe card, and an addressable test chip integrated with the new type of address register: at least one source measurement unit (SMU) connected to the power pads VDD and VSS through the probe card, to provide power for the test chip; at least one SMU connected to the switch matrix module, and the switch matrix module connected to the input pads SE and SI of the address register through the probe card; at least one SMU connected to the RST pad of the address register in the test chip through the probe card; the function generator connected to the pad CLK of the multipurpose register through the probe card; at least two SMUs are test SMUs, and these test SMUs connected to the test pads (which are connected to DUTs' ports through switch circuit) in the addressable test chip through the probe card, so as to provide voltage and realize data test for the test chip; the function generator also connected to the test SMU; the database in the test apparatus is used to store the test results.

In some embodiments, the address register is integrated in the probe card, and the addressable test chip test system includes a test apparatus, an addressable test chip and a probe card integrated with the new type of address register: at least one SMU connected to the power pads VDD and VSS through the probe card, to provide power for the addressable test chip; at least one SMU connected to the switch matrix module, and the switch matrix module connected to the input pads SE and SI of the address register in the probe card; the output of the address signal from the address register connected to the address signal pads of the addressable test chip; at least one SMU connected to the address register through the reset signal RST; the function generator connected to the address register through the clock signal CLK; at least two test SMU are test SMUs, and these test SMUs connected to the test pads (these test pads are connected to DUTs' ports by switch circuit) of the test chip through the probe card; the function generator also connected to the test SMU; the database in the test apparatus is used to store the test results.

The address register integrated into addressable test chips or integrated into the probe card has its advantages and disadvantages. (1) As mentioned before, integrating the address register into addressable test chip, only several address register pads can be used to instead many address pads in the common addressable test chip, which can greatly reduce the occupied area of the pad in the addressable test chip, high-density test chips with device density >1000/mm$^2$ can be designed and fabricated, but the performance of address register will be affected by IC manufacturing process because of the address register is fabricated with test chip through the IC manufacturing process. (2) Integrating the address register into a probe card and using a addressable test chip without the address register in the test system, although the DUT density of common addressable test chip less than 1000/mm2, this method is very convenient because the simple design and mature manufacturing process of probe card, the performance of the address register is stable, and the probe card can be reused to realize the recycling of resources.

Comparing with common addressable test chip test system, the addressable test chip test system disclosed in the disclosure: (1) the test system provides with two test modes result of including a new type of address register, user can select the diagnostic test mode and the sequential test mode according to the requirement; especially for sequential test mode, the function generator and the address register work together to generate continuous address signals can test all DUTs continuously and quickly, this test mode does not need user write test plan, and does not need the test apparatus to configure an address for each DUT every time, it can improve the test efficiency effectively; (2) the test system provides a quickly tested method: the function generator generates clock pulse signals to stimulate the address register to select one or more DUTs to be tested, at the same time, the clock pulse signal is output into the test SMUs in the test apparatus to trigger the test apparatus to enter test state; therefore, the test apparatus will test the selected DUT immediately when the DUT is selected to improve the test speed significantly; (3) when the new type of address register is integrated into common addressable test chip, the new type addressable test chip has high density DUTs and the number of DUT can reach to >1000/mm$^2$; (4) All DUTs are connected to four ends through signal lines to improve the test accuracy; 5) Multi-stage transmission gate structure is used as switching circuit in the addressable test chip and can decease the background leakage current of the unselected DUTs, therefore, electrical parameters of the selected DUT can be tested with more accuracy; 6) the test system provides a new type of addressable test chip configured with a forcing circuit and a sensing circuit, more accurate resistance can be obtained through forcing a low current into the sensing circuit.

In some embodiments, the addressable test chip test system includes an address register that is integrated in the probe card. The connect relationships of the addressable test chip test system is as follows: at least one SMU is connected to the power pads through the probe card, to provide power for the addressable test chip; at least one SMU is connected to the switch matrix module, and the switch matrix module is connected to the input pads SE and SI of the address register in the probe card; the output of the address signal from the address register is connected to the address signal pads of the addressable test chip; at least one SMU is connected to the address register through the reset signal RST; the function generator is connected to the address register through the clock signal CLK; at least two SMUs are test SMUs, and these test SMUs are connected to the test pads of the test chip through the probe card; the function generator is also connected to the test SMUs; the database in the test apparatus is used to store the test results. In some embodiments, the addressable test chip test system includes an address register that is integrated in the addressable test chip and constitutes a new type of addressable test chip: the input end of the address register is connected to address register pads in the test chip; the output end of the addressing circuit is connected to the first port of the switching circuit, the second and third port of the switching circuit is connected to DUTs and test pads through signal lines; the address register outputs address signals which are decoded by the addressing circuit as address select signals, and these address select signals control a switching circuit to select the DUT to be tested.

DETAILED DESCRIPTION

With the shrinking of integrated circuit (IC) manufacture process, the number of transistors in single chip is increasing, the yield of advanced IC technology is also facing many challenges. In the background of manufacturability, test chip is used to monitor and improve the yield of IC manufacture effectively. Traditional short-range test chip, each port of the being tested DUT (device under be tested) individually connect to the probe pin (PAD). PADs occupy large area in wafer, therefore, the number of PAD is limited, resulting in the number of devices under to test (DUTs) can be measured is limited, and low rate area utilization of test chip. So that test chips designed by this method are unable to meet the needs of device statistical modeling.

Figure 5A:
FIG. 5A illustrates a type of addressable test chip without address register.

Addressing circuit can be used to test numerous devices because of the advantage of sharing PADs in testing, engineers integrated it into test chip design to test more devices. As shown in FIG. 5A, ordinary addressable test chip includes a plurality of PADs (labeled as "P," "A," "T" in figure), addressing circuit, switching circuit and DUTs. The addressing circuit connects to address signal pads (labeled as "A" in figure) and obtains address signal through the address signal pads, the addressing circuit also connects to switching circuit and outputs address select signals to control switches of the switching circuit in on-state or off-state; the switching circuit connects to DUTs and selects a single DUT to be tested through the switch state; the addressing circuit also connects to power pads (labeled as "P" in figure) and the power pads supply power for the whole test chip, the switching circuit also connects to test pads (labeled as "T" in figure) and the test pads supply test points for the whole test chip.

Various embodiments of the present disclosure will be further described in conjunction with the drawings and specific embodiments, but the scope of protection of the present disclosure is not limited thereto.

Example 1

An addressable test chip test system includes a test apparatus, a probe card and an addressable test chip, the test apparatus connects to the addressable test chip through the probe card to constitute a test path, the above addressable test chip is an addressable test chip configured with an address register.

Figure 1:
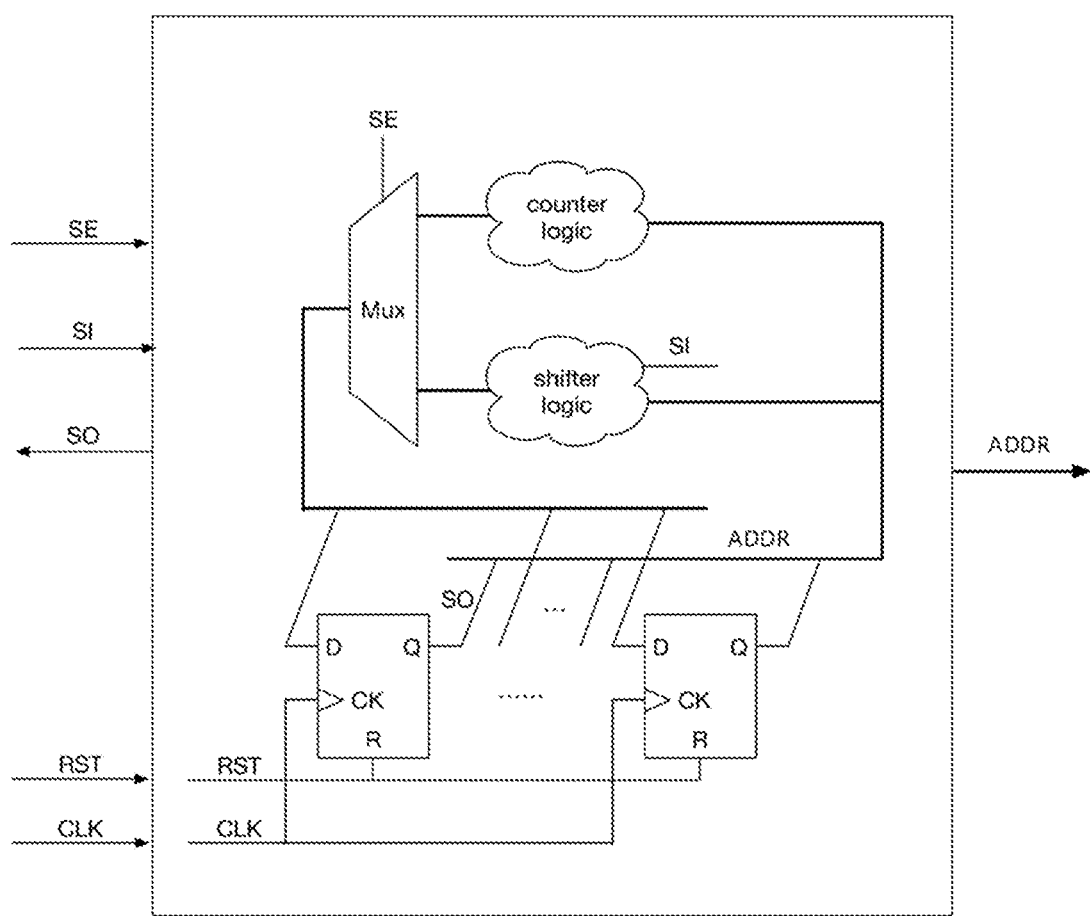
FIG. 1 illustrates a circuit structure of the address register according to some embodiments.

The address register can implement the function as a counter or a shifter through changing its external signal. As shown in FIG. 1, the address register includes a plurality of edge-triggered flip-flop registers, a counter logic, a shifter logic and a multiplexer; the input ports include a reset signal RST, a clock signal CLK, a shift enable signal SE, a shift data input signal SI, the output ports include a scan data output signal SO and several address signals ADDR. The internal connection of the address register is as follows: the input D of edge-triggered flip-flop registers connected to the data output of the multiplexer, the input R of edge-triggered flip-flop registers s connected to RST of address register, the input CK of edge-triggered flip-flop registers connected to CLK of address register, the output Q of edge-triggered flip-flop registers connected to ADDR of address register, the input of the counter logic is connected to ADDR of address register; the input of the shifter logic connected to ADDR and SI; the input of the multiplexer connected to SE, the output of the counter logic and the shifter logic. The shift enable signal SE controls multiplexer, the signal chooses one device to work between the counter logic and the shifter logic. When SE=1, the shifter logic is selected, each time the edge of the clock signal is changed, the address signal shifts 1 bit to right, the lowest bit is discarded, the highest bit is changed to SI; any address signal can be inputted from the outside through this mode. When SE=0, the counter logic is selected, if the signal clock signal (CLK) is running, each time the edge of the clock signal is changed, the address signal ADDR can be changed to ADDR+1, the address signal can realize increase in sequence through this mode; if clock signal is stopped, the address signal ADDR is unchanged, and the address signal can be changed through the above mode of SE=1.

Figure 2:
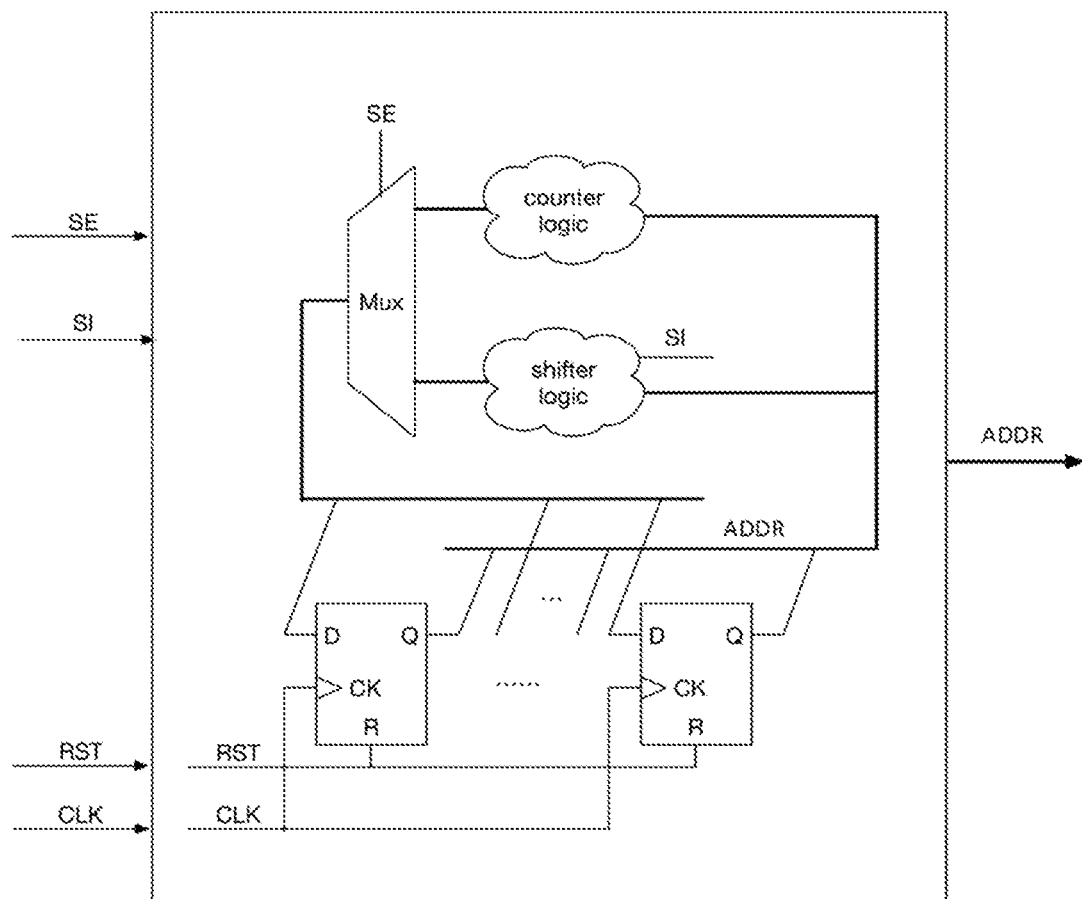
FIG. 2 illustrates another circuit structure of the address register according to some embodiments.

The scan data output signal (SO) is configured to check whether DUT is the one we want to test when the address register is integrated into the addressable test chip test system, in some embodiments, the SO output port can be omitted, as shown in FIG. 2.

In some embodiments, the address register can be configured with two or more counter logics and two or more shifter logics, in case of one counter logic or shifter logic does not work to affect the whole chip.

Figure 3A:
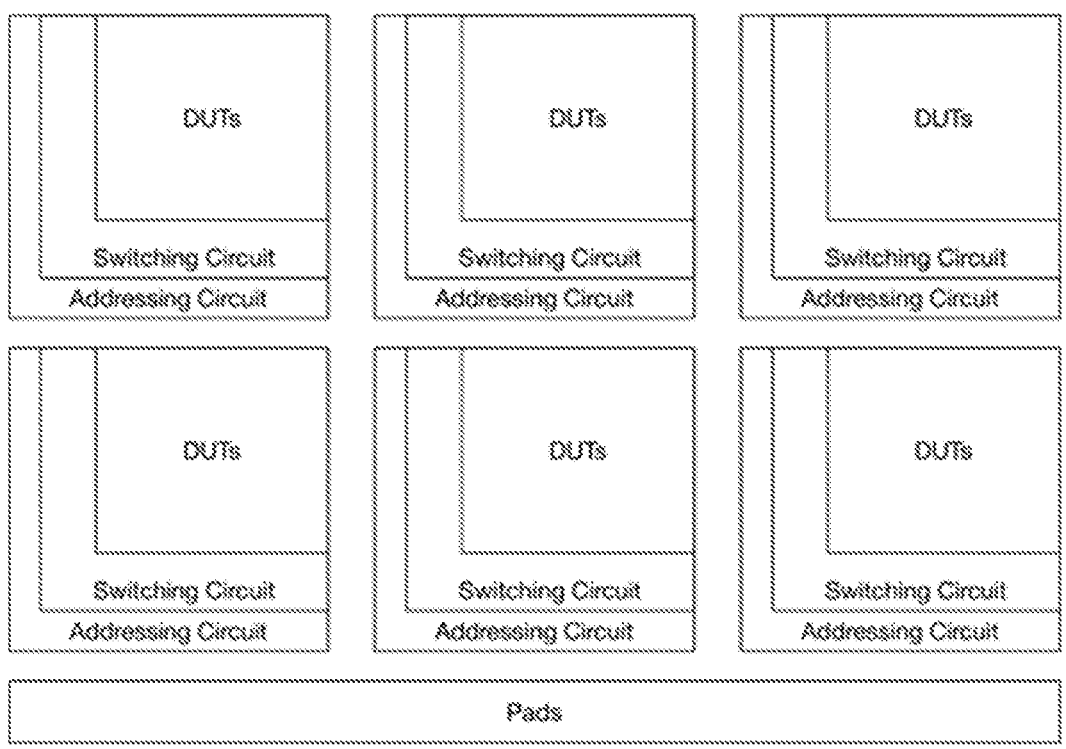
FIG. 3A illustrates a type of addressable test chip without address register.
Figure 4A:
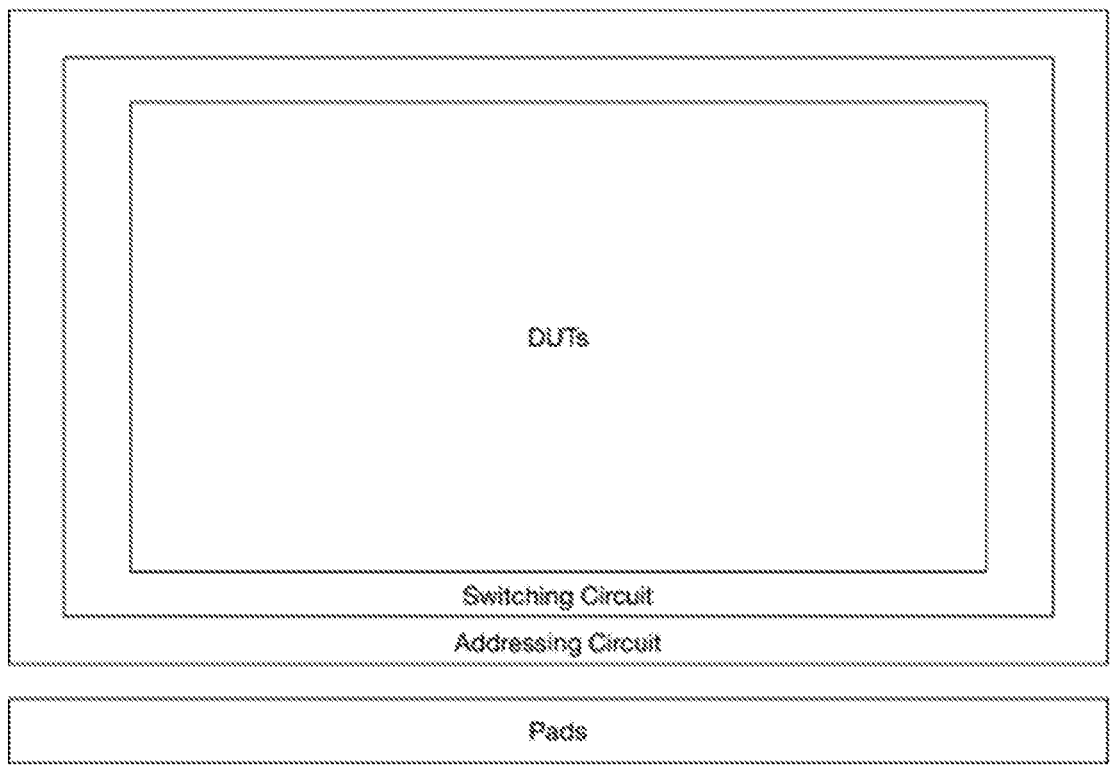
FIG. 4A illustrates a type of addressable test chip without address register.

For addressable test chip, there are three most common layout structures, as shown in FIG. 3A, FIG. 4A, FIG. 5A. All the DUTs in FIG. 3A are divided into a plurality of DUT arrays, each array configured with a set of switching circuit and addressing circuit; the type of test chip is suitable for numerous DUTs and precision requirements is not very high. In FIG. 4A, all DUTs of the addressable test chip share a set of switching circuits and addressing circuits; this type test chip is suitable for numerous DUTs and precision requirements is not very high, unlike the type test chip shown in FIG. 3A, this type test chip can be applied into the actual product layout, and the key components can be tested without modifying the actual product layout. As shown in FIG. 4A, the "switching circuit" is labeled as "S," the "addressing circuit" is labeled as "A," the "Address Register" is labeled as "R"; all DUTs are divided into a plurality of DUT blocks, and all blocks are similar to "series" arrangement, the number of DUT in each block is small; moreover, each block is configured with a set of switching circuit and an addressing circuit; this type of test chip is suitable for small number of DUTs, it occupies small area and can be placed in the scribe line of wafer.

Figure 3B:
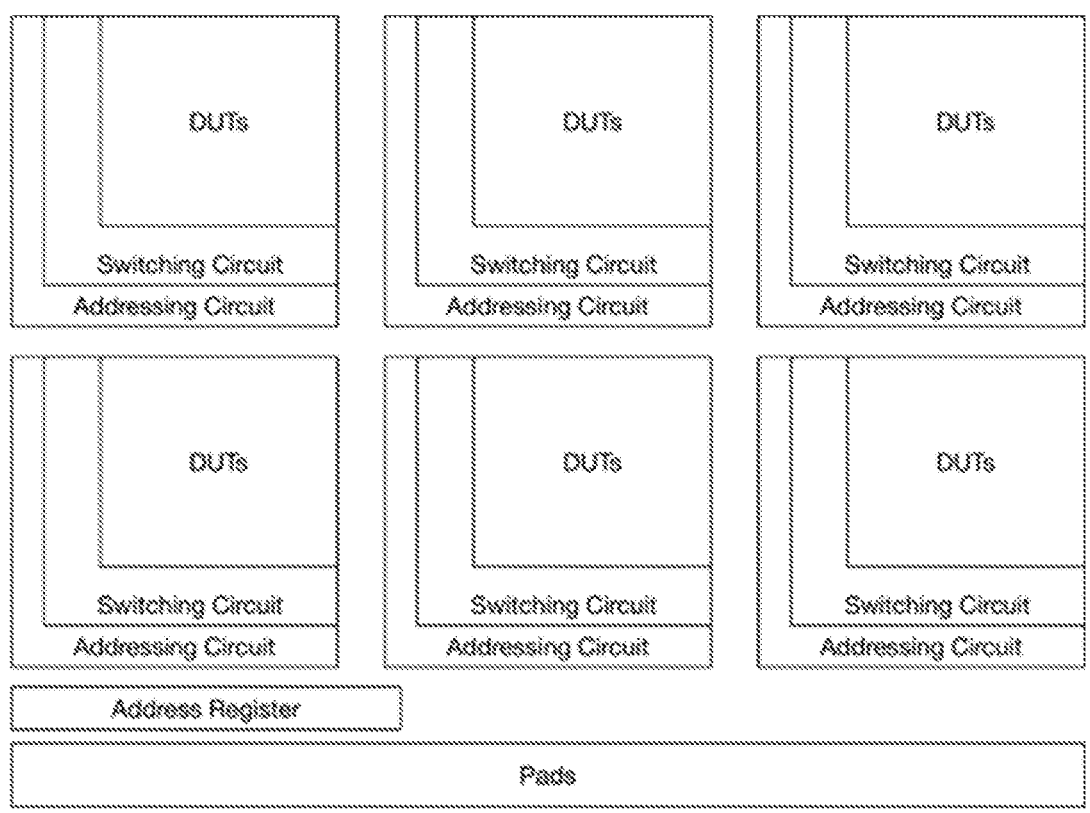
FIG. 3B illustrates a type of addressable test chip integrated with address register.
Figure 4B:
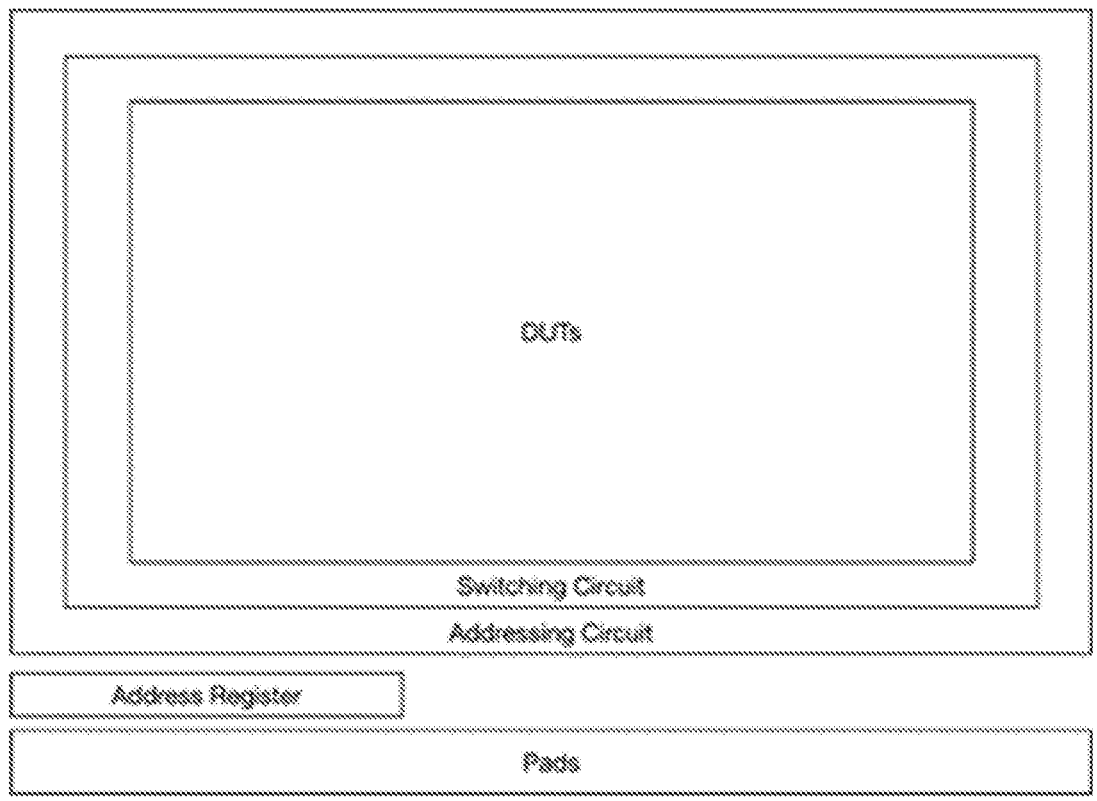
FIG. 4B illustrates a type of addressable test chip integrated with address register.
Figure 5B:
FIG. 5B illustrates a type of addressable test chip integrated with address register.

In the embodiment, the address register is configured into common addressable test chip. FIG. 3B, FIG. 4B, and FIG. 5B are layout structures of three types of addressable test chips configured with address registers.

Figure 6A:
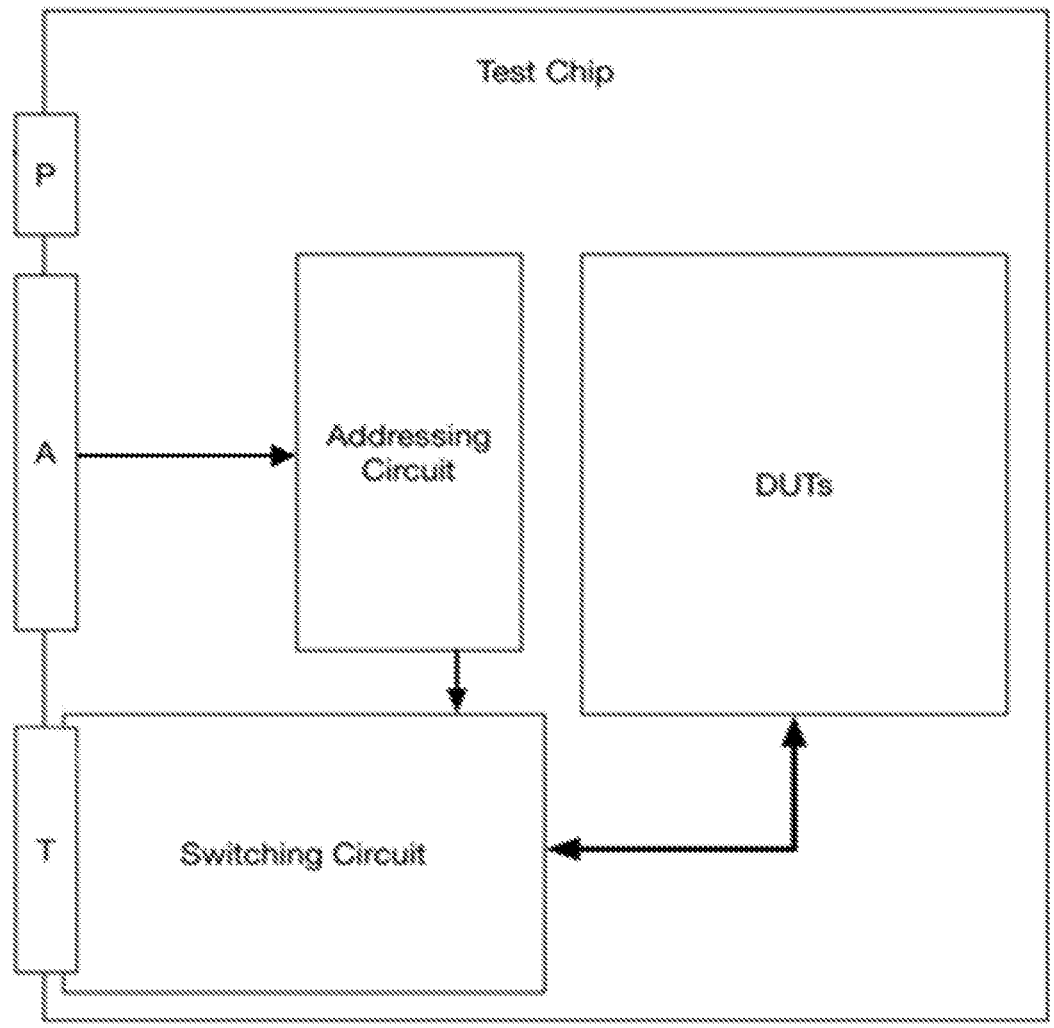
FIG. 6A illustrates a common addressable test chip without address register.

All types of common addressable test chip can be expressed in FIG. 6A. "Power pads" is labeled as "P" in figure, "address signal pads" is labeled as "A," "Test pads" is labeled as "T." In this embodiment, the address register configured in a common addressable test chip can be expressed in FIG. 6B. The input end of the address register connected to the address register pad (is labeled as "R" in figure) of the test chip, the output address signal end of the address register connected to the input end of the addressing circuit, the output of the addressing circuit connected to the first port of the switching circuit, the second and third port of the switching circuit connected to DUTs and test pads (is labeled as "T" in figure) through signal lines. The address register outputs address signals, these address signals are decoded by the addressing circuit as address select signals, these address select signals control switching circuit to select DUT to be tested.

The address signal of common addressable test chip is inputted to addressing circuit through address signal pads (labeled as "A" in FIG. 6A), these address signals are decoded by the addressing circuit as address select signals to control switching circuit to select DUT to be tested, the number of DUT is equal to the number of address select signals, so that, the number of the address signals and the number of address signal pads are determined by the number of address select signals or the number of DUT. For example, there are 128 DUTs, then 128 address select signals are needed. According to the principle of digital signal, 128 address select signals can be generated by 7 ($\log_2 128=7$) address signals, which means that the number of address signal pads is 7. As the development of the IC in high integration degree and high manufacturing area utilization ratio, the test chip faced many demands, much higher density DUTs needed to improve the failure detection rate and save the cost of manufacturing area. But more DUTs means more address signal pads, the area of a pad is much bigger that a DUT in test chip, more address signal pads must limit the number of DUT. To solve this problem, in this embodiment, an address register is integrated into a common addressable test chip to constitute a new type of addressable test chip, only a few of the address register pads can instead of many address signal pads which will increased as the number of DUT grows, this type of addressable test chip can greatly improve the area utilization of the test chip, it can accommodate about $10^6$ orders of magnitude DUTs in 10 mm² area.

Figure 7:
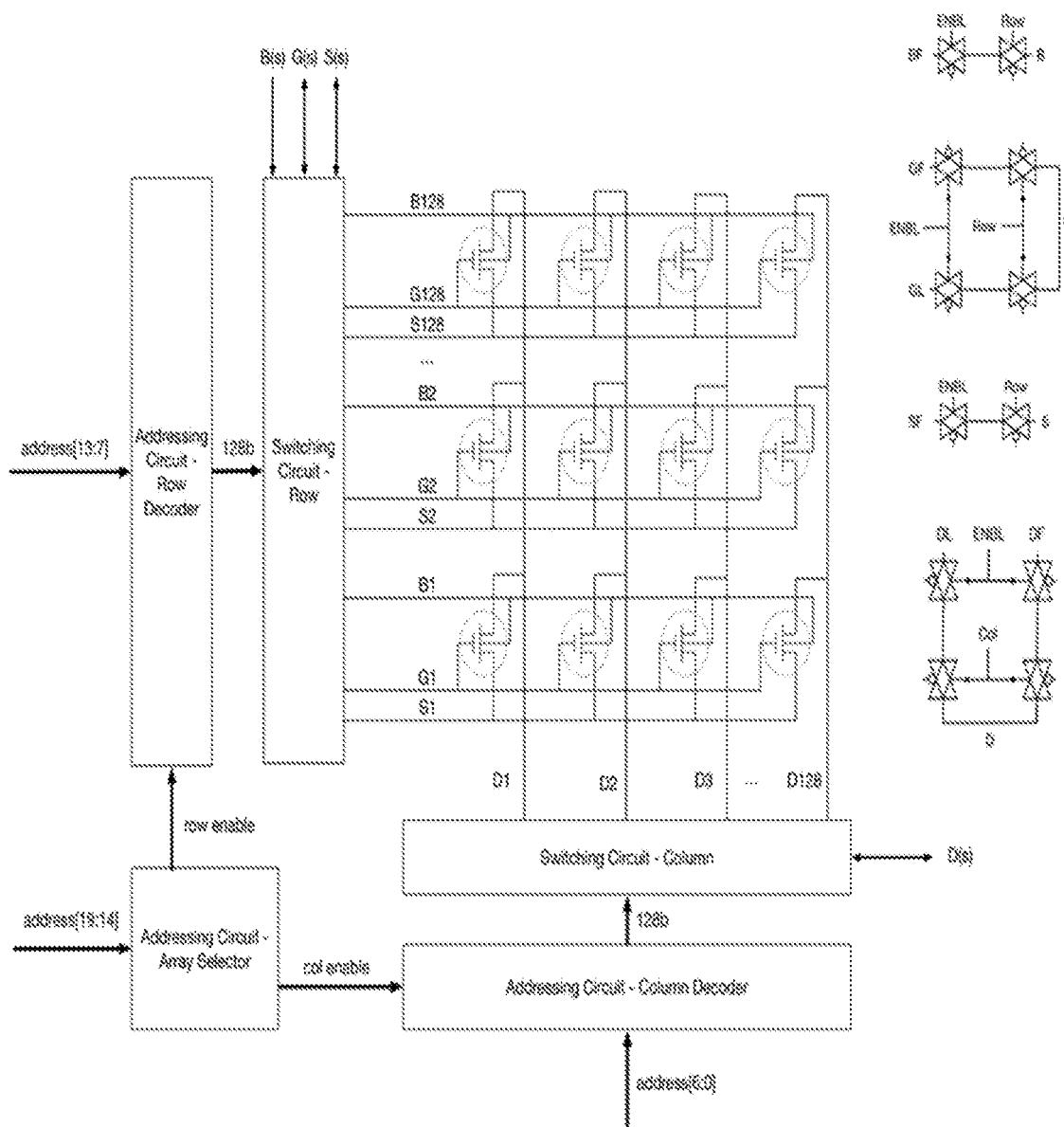
FIG. 7 illustrates an array structure of the type addressable test chip of FIG. 3B according to some embodiments.

In the embodiment, the DUT is transistor, and four-terminal measuring techniques can be employed to test the transistor. The layout of the addressable test chip in this embodiment is shown in FIG. 3B and FIG. 7. The test chip includes an address register, several addressing circuits, several switching circuit, a plurality of transistors (DUTs) and a plurality of pads. The test chip occupies an area of 10 mm², all the transistors are divided into 64 (8×8) arrays, each array contains 16,384 (128×128) transistors. This means that, 1,048,576 (8×8×128×128) transistors can be accommodated in the area of 10 mm². Each array is configured with a set of addressing circuit and switching circuit; the addressing circuit includes an array selector, a row decoder and a column decoder. In some embodiments, the buffers are configured to the row and column decoder to solve the problem of too long metal wiring connection and signal integrity.

In this embodiment, the transistors in test chip are divided into 64 ($2^6$) arrays, each array contains 16,384 ($2^7 \times 2^7$) transistors, so that, 20-bit address signals need to be output by the address register. The 6 bit address signals are used to generate $2^6$ array select signals to control one or more arrays in a state of preparing to be test; 7 bit address signals are used to control row decoder to generates $2^7$ row address select signals; 7 bit address signals are used to control column decoder to generates $2^7$ column address select signals; therefore, a single DUT can be selected to be tested in each array which is selected by array select signals.

As shown in FIG. 7, the switching circuit includes a plurality of transmission gates. In each array, the B, S and G ends of transistors in a row are connected respectively to the B, S, G end signal lines which controlled by the row addressing circuit, and the D end of transistors in a column are connected to the D end signal line which is controlled by the column addressing circuit. Specifically, the B end of the transistors in a row are connected to the signal line BF through a transmission gate, the S end of the transistors in a row are connected to the signal line SF through a transmission gate, the G end of the transistors in a row are connected to the signal line GF and GL through a transmission gate respectively, the D end of the transistors in a column are connected to the signal line DF and DL through a transmission gate respectively. The transmission gates at the BF, SF, GF and GL ends are controlled by the address select signal which generated by the row addressing decoder, and the transmission gates at the DF and DL ends are controlled by the address select signal which is generated by the column addressing decoder.

Fourteen pads are needed in the test chip, which includes: the power pads VDD and VSS; input signal pads of address register RST, SE, SI, AEN and CLK; output signal pad of address register SO, and the test pads BF, SF, GF, GL, DF and DL. In all test pads, DF or DL end is output end of test data, when several arrays are tested at the same time (parallel testing), therefore, several pair of DF and DL pads are needed. In some embodiments, all DUTs aren't divided into several arrays and the array select signals is not needed, so that, there is no AEN pads, and the number of pads is 13. The output address register signal (SO) is the lowest position of the address signal which is used for check whether DUT is the one we want to test. In some embodiments, there is no scan data output signal pad SO, and the number of pads is 13. In some embodiments, there are no AEN and SO signals, and the number of pads is 12.

In this embodiment, the test apparatus of the test system includes a function generator (labeled as "FGen" in FIG. 8), switch matrix module (labeled as "SWM" in FIG. 8), at least six source measurement units (SMUs), a database and an online analysis engine. Therefore, the test apparatus, the prober card and the addressable test chip integrated with address register can constitute the test system of the embodiment, as shown in FIG. 8.

Figure 8:
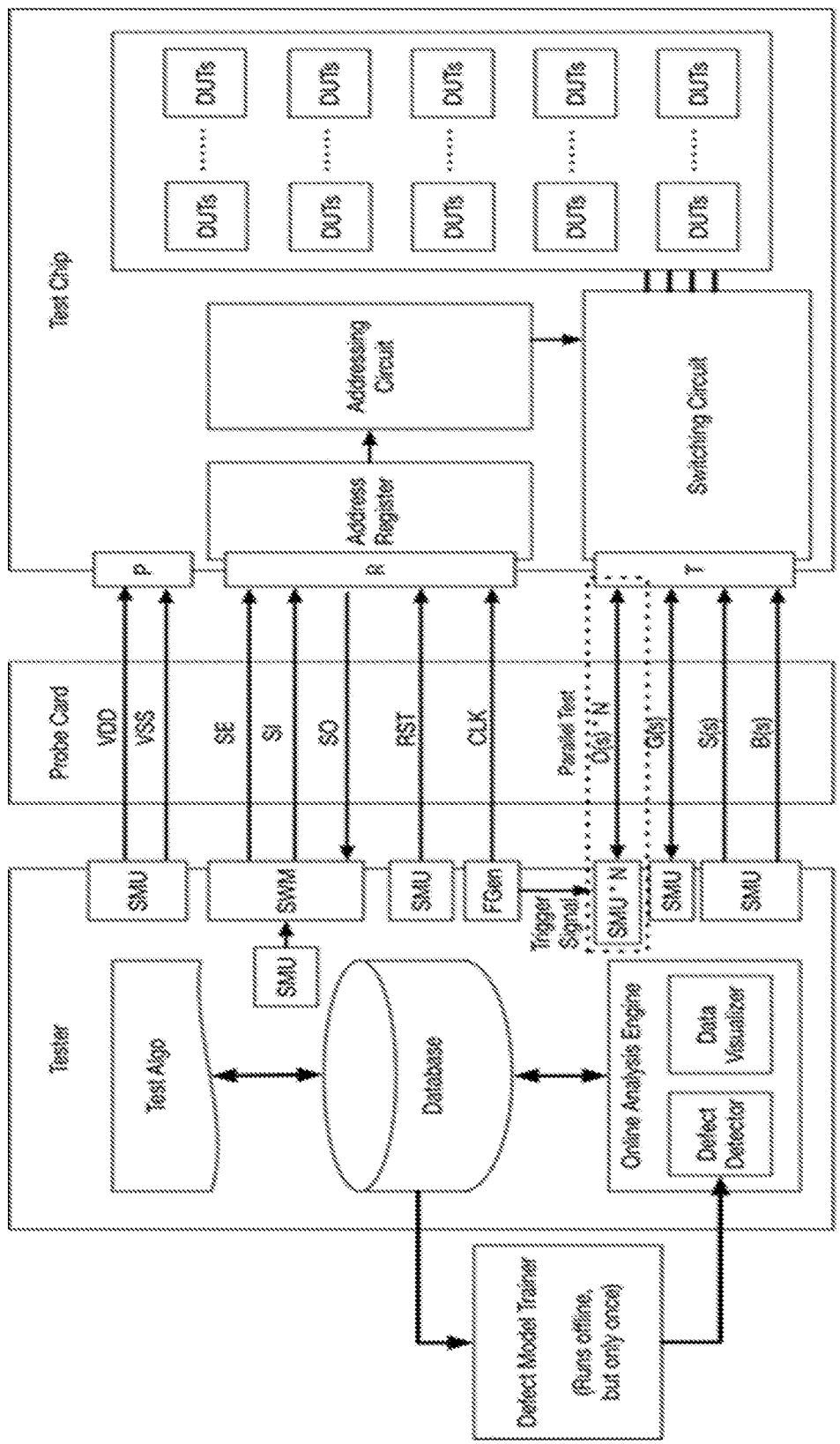
FIG. 8 illustrates an addressable test chip test system according to some embodiments.

In FIG. 8, "power pads" is labeled as "P," "address register pads" is labeled as "R," "test pads" is labeled as "T." The first source measurement unit (SMU) is connected to the power pads VDD and VSS in the addressable test chip through the probe card, the first SMU provides power to the test chip; the second SMU is connected to the switch matrix module, the switch matrix module is connected to the input pads SE, SI and output pad SO of the address register through the probe card; the third SMU is connected to the input pads RST of the address register in the test chip through the probe card; the function generator is connected to the input pads CLK of the address register through the probe card; the fourth, fifth and sixth SMU are test SMUs, and the test SMUs are connected to the test pad DF, DL, GF, GL, SF, SL and BF through the probe card, so as to provide voltage and realize data test for the test chip; the function generator is also connected to test SMUs; the database in the test apparatus is used to store data, the online analysis engine is used to analyze the data. In some examples, the online analysis engine is excluded in the equipment, the data can be output and analyzed by external module. In some examples, the database is not an independent structure but integrated in other device, such as some type of SMUs that have the functions to store data.

Before the test system is tested, the test apparatus is configured to connect with the probe card; in response to the test requirement, the test apparatus controls the probe card to connect with the addressable test chip; the first SMU provides power for addressable test chip; the function generator generates a clock pulse signal, the clock pulse signal stimulates the address register in addressable test chip to generate address signals, the address signal is decoded to address select signals through addressing circuit, the address select signal controls the switching circuit to select DUT to be tested, at the same time, the clock pulse signal generated by the function generator is fed back into the test SMU of the test apparatus to trigger the test apparatus to enter the test state; therefore, the test apparatus will test the selected DUT immediately when the DUT is selected.

Based on the function of address register, when the shift enable signal SE=1, the shifter logic in the address register is selected, and the address register has the same function as a shift register, the test chip entries the address configuration mode: each time the edge of the clock signal is changed, the address register 1) shifts all address bits right 1 bit, 2) reads the shift data input SI into the highest address bit, and 3) the lowest address bit is discarded. After all address bits have been shifted in, the address register is configured to the desired address. When the shift enable signal SE=0, the counter logic in the address register is selected, and the address register has the same function as a counter, the test chip entries either the sequential test mode if the clock signal is running, or the diagnostic test mode if the clock signal is stopped. In the sequential test mode, each time the edge of the clock signal is changed, the address is transformed to the next address (address+1), and the corresponding DUT is tested by the test apparatus; as the clock pulse keeps running, all DUTs will be successively tested by the test apparatus. In the diagnostic test mode, the clock signal is stopped, thus the selected DUT will not be changed, the selected DUT can be diagnosed by adjusting the voltages of its terminals, e. g. plot the Id-Vg curve of a transistor DUT, by changing the voltage on gate terminal; if the other DUTs need to be tested, reconfigure the address to select a DUT to test every time.

In some embodiments, the clock pulse signal generated by the function generator is not output into the test SMU directly, but though a buffer to output into the test SMU, the buffer can be configured to test apparatus or probe card. The input of the buffer is connected to the output of the function generator, the output terminal of the buffer is connected to the test SMU. When the test requirements occur, the function generator generates a clock pulse signal; the clock pulse signal stimulates the address register in addressable test chip to generate address signals, the address signal are decoded to address select signals through addressing circuit, the address select signal control switching circuit to select DUT to be tested, at the same time, the clock pulse signal is input to the buffer, the buffer fed back the clock pulse signal to the test SMU in the test apparatus to trigger the test apparatus to enter the test state. The added buffer is used to solve the time difference between selecting DUT and triggering the test apparatus to enter the test state.

In some examples, more/less than six source measurement units are configured in the test apparatus due to the different type of DUT and circuit design. Sometimes, more SMUs is used to keep the circuit more stable, two or more SMU are required to supply power; sometimes, or when the parallel testing is needed, therefore, more pair of DF and DL pads are needed, and more SMUs is needed to connect to DF and DL pads. As shown in FIG. 8, for example, there are N DUTs needed to be tested at the same time, the addressable test chip should be configured with N pair of pads, and the number of the fourth SMU should configure N for the test apparatus; in other words, the number of the fourth SMU is same to the number of DUT of parallel testing.

In common test systems, (1) the test state is triggered after testing the DUT is selected; (2) common test system adopts SMU to generate address signal directly, a DUT needs to be selected and test each time, engineer needs to adjust or write test plan to adjust SMU to generate a needed address signal, and the test apparatus needs to configure an address for each DUT every time, for numerous DUTs, it is a complicated and tedious work, and the test efficiency is very low.

Figure 9:
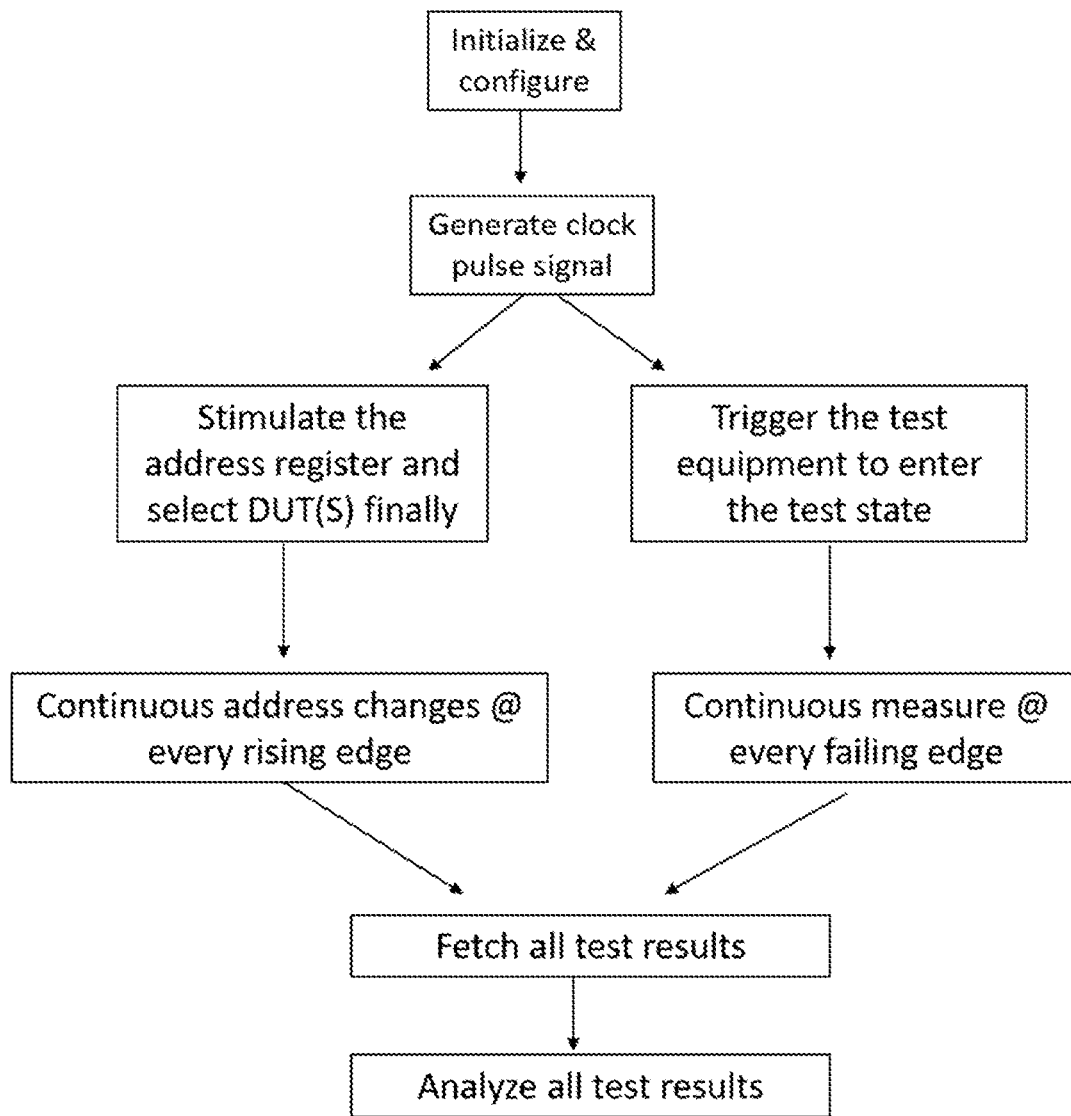
FIG. 9 illustrates the test method of the addressable test chip test system of FIG. 8 according to some embodiments.
Figure 10:
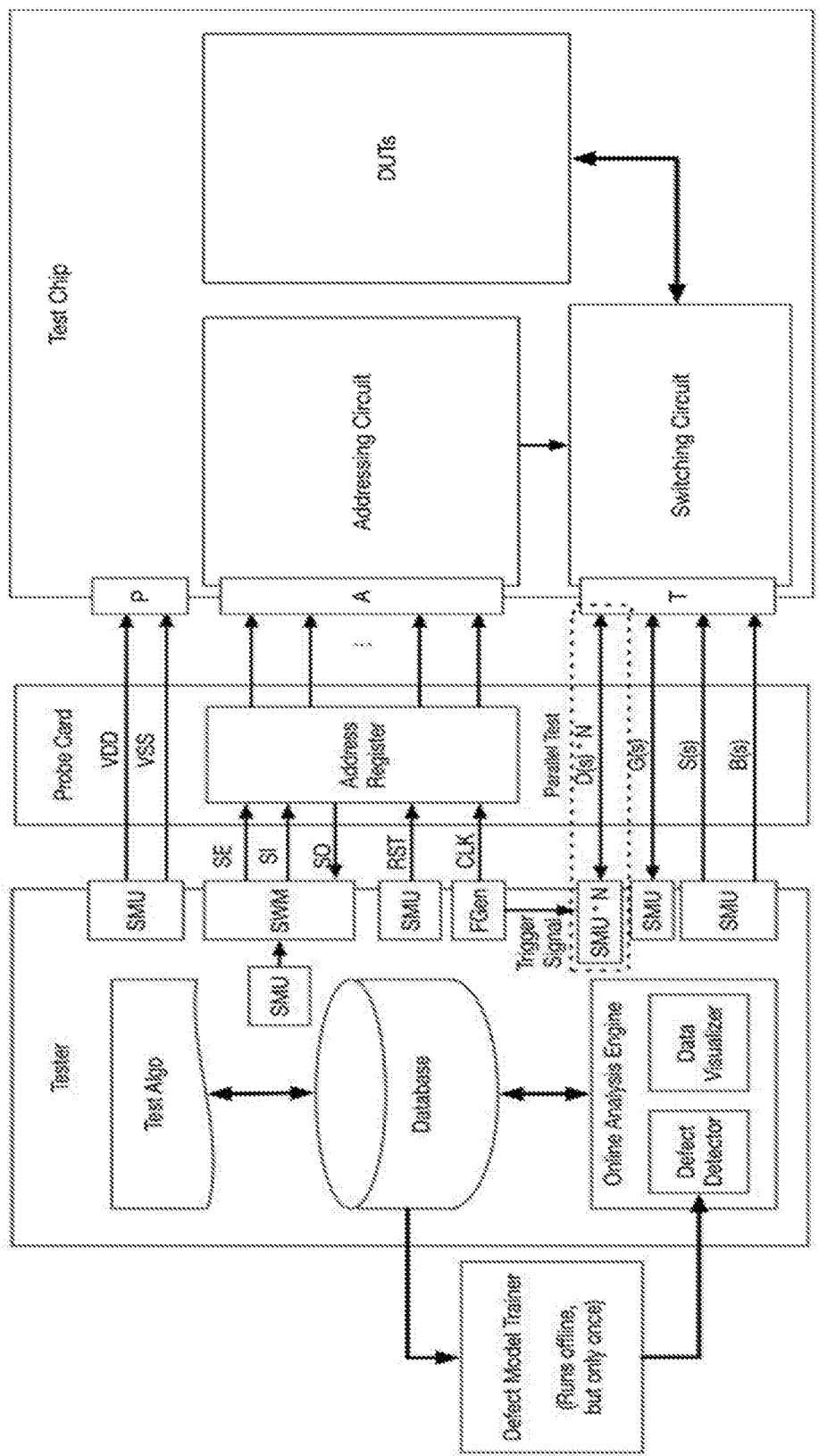
FIG. 10 illustrates an addressable test chip test system according to some embodiments.

In the test system, the function generator is connected to the address register and the test SMU, this connection type can provide a new test method: the selection of DUT in the test chip and enable the test apparatus into test state are completed at the same time, and the test efficiency has been greatly improved. The test method is shown in FIG. 9, after initializing and configuring the test apparatus, the function generator generates a clock pulse signal, the clock pulse signal stimulates the address register in addressable test chip to generate address signals, the address signals are decoded to address select signals through addressing circuit, the address select signal control switching circuit to select DUT to be tested, at the same time, the clock pulse signal generated by the function generator is fed back into the test SMU of the test apparatus to trigger the test apparatus to enter the test state; therefore, the test apparatus will test the selected DUT immediately when the DUT is selected. All test data is stored into the test SMUs momentarily, when all the tests are completed, the test algorithm (test algo) will control the database to fetch all test results, the online analysis engine will analyze all test results and store them into a database.

Moreover, in the test system of the disclosure, the address register can implement the logic function of the counter and the shifter. Continuous address signals can be generated when the counter logic is used, the devices can be quickly tested by the test system without reading test plan and adjusting the SMU.

Example 2

An addressable test chip test system includes a test apparatus, a probe card and an addressable test chip, the test apparatus connects to the addressable test chip through the probe card to constitute a test path. An address register is integrated in the probe card, the address register is a new type of address register in EXAMPLE 1. The test apparatus of this embodiment is the same as the test apparatus in EXAMPLE 1, the addressable test chip in this embodiment is a common addressable test chip as shown in FIG. 5A.

In the test system, the first SMU in the test apparatus connected to the probe card, the probe card connected to the addressable test chip through the power pads (labeled as "P" in FIG. 9) VDD and VSS; the second SMU connected to the switch matrix module (labeled as "SWM" in FIG. 8), and the switch matrix module connected to the address register through the shift enable signal SE, the shift data input signal SI and the scan data output signal SO, the address register connected to address signal pads in the addressable test chip; the third SMU connected to the address register through the reset signal RST; the function generator connected to the address register through the clock signal CLK; the fourth, fifth and sixth SMU are test SMUs, and these test SMUs connected to the test pad DF, DL, GF, GL, SF, SL, BF through the probe card; the function generator also connected to the test SMU in the equipment; the online analysis engine and the database connected to the test SMU, and the online analysis engine is used to analyze test results, the database is used to store data. In some examples, the online analysis engine is excluded in the equipment, the data can be output and analyzed by external module. In some examples, the database is not an independent structure, but can be integrated in other device, such as some type of SMUs that have the functions to store data.

Before the test system is tested, the test apparatus is configured to connect with the probe card; in response to the test requirement, the test apparatus controls the probe card to connect with the addressable test chip; the first SMU provides power for addressable test chip; the function generator generates a clock pulse signal, the clock pulse signal stimulates the address register in addressable test chip to generate address signals, the address signals are decoded to address select signals through addressing circuit, the address select signal control switching circuit to select DUT to be tested, at the same time, the clock pulse signal generated by the function generator is fed back into the test SMU of the test apparatus to trigger the test apparatus to enter the test state; therefore, the test apparatus will test the selected DUT immediately when the DUT is selected. Based on the function of address register, when SE=1, the shifter logic in the address register is selected, and the address register has the same function of a shift register, the test chip entries the address configuration mode: each time the edge of the clock signal is changed, the address register reads an address data from the shift data input signal SI, and the selected DUT will be tested by the test apparatus, when the DUT test is completed, the test system will read the test plan and according to the next address data will select the next DUT to be tested; when SE=0, the counter logic in the address register is selected, and the address register has the same function of a counter, the test chip entries the sequential test mode: each time the edge of the clock signal is changed, the address bit is transformed to the next address bit, all DUTs will be successively and fast tested by the test apparatus from the first DUT to the last DUT without reading the test plan.

In some embodiments, the clock pulse signal generated by the function generator is not output into the test SMU directly, but though a buffer to output into the test SMU, the buffer can be configured to test apparatus or a probe card. The input of the buffer is connected to the output of the function generator, the output terminal of the buffer is connected to the test SMU. When the test requirements occur, the function generator generates a clock pulse signal; the clock pulse signal stimulates the address register in addressable test chip to generate address signals, the address signals are decoded to address select signals through addressing circuit, the address select signal control switching circuit to select DUT to be tested, at the same time, the clock pulse signal is input to the buffer, the buffer fed back the clock pulse signal to the test SMU in the test apparatus to trigger the test apparatus to enter the test state. The added buffer is used to solve the time difference between selecting DUT and triggering the test apparatus to enter the test state.

In some examples, more/less than six source measurement units are configured in the test apparatus due to the different types of DUTs and circuit designs. Sometimes, more SMUs is used to keep the circuit more stable, two or more SMU are required to supply power; sometimes, or when the parallel testing is needed, therefore, more pair of DF and DL pads are needed, and more SMUs is needed to connect to DF and DL pads. As shown in FIG. 8, for example, there is N DUTs needed to be tested at the same time, the addressable test chip should be configured with N pair of pads, and the number of the fourth SMU should configure N for the test apparatus; in other words, the number of the fourth SMU is same to the number of DUT of parallel testing.

The test method is the same to EXAMPLE 1. The differences with EXAMPLE 1 can include, integrating the address register into a probe card not into a common addressable test chip, although the DUT density of common addressable test chip is less than 1000/mm2. This method is very convenient because of the simple design and mature manufacturing process of probe card, the performance of the address register is stable, and the probe card can be reused to realize the recycling of resources.

Example 3

An addressable test chip includes at least one switching circuit, at least one addressing circuit, a plurality of DUTs and a plurality of pads; the DUTs can be divided into one or more DUT arrays, where a pair of addressing circuit and switching circuit are configured to each DUT array; the switching circuit is a multi-stage transmission gate circuit comprising multiple transmission gate structures.

For the switching circuit, each stage of the circuit includes at least one transmission gate structure; each transmission gate structure includes at least one transmission gate; the output end of each high-level transmission gate can be connected to low-level transmission gate(s)' input ends of a low-level transmission gate structure, the output ends of the lowest level transmission gates can be coupled to terminals of DUTs.

In some embodiments, the input ends of the highest level transmission gate connected to test pads; the input end of each transmission gate also connected to the decoder in the addressing circuit In some embodiments, for multi-stage transmission gate structures, each same-level transmission gate connected to the same number of low-level transmission gates to ensure the same test accuracy of each DUT.

In some embodiments, the input ends of the same-level transmission gates are connected with the same decoder.

Figure 11:
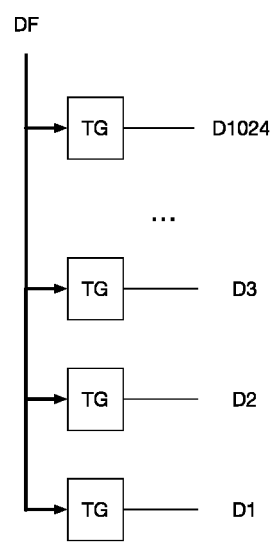
FIG. 11 illustrates the structure of one-stage transmission gate according to some embodiments.
Figure 14:
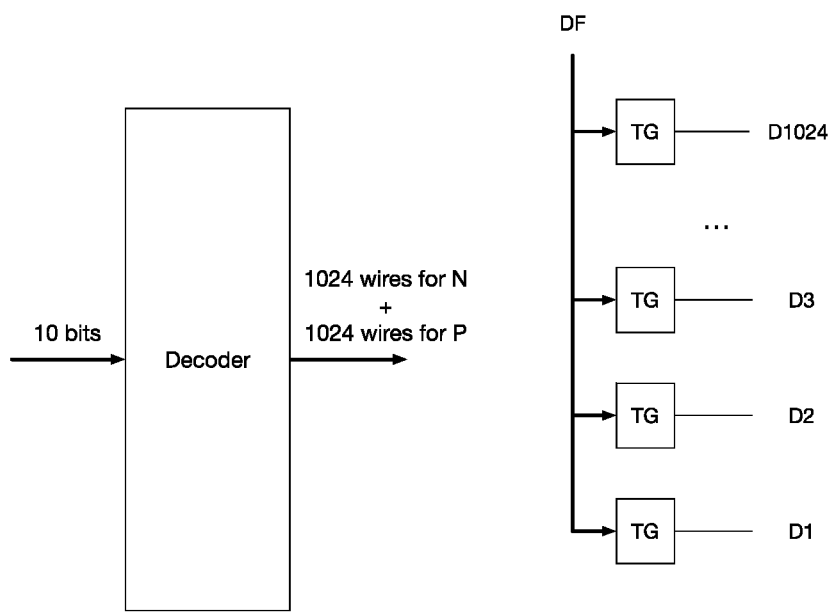
FIG. 14 illustrates the structure of one-stage transmission gate structures configured with decoders.

Common switching circuit is a one-stage transmission gate circuit, as shown in FIG. 11, in this figure, the number of DUT is 1024, therefore, for one test signal line (in the example, take DF test signal line as an example), 1024 transmission gates are configured to one terminal (Drain terminal) of the DUTs respectively, the input ends of these transmission gates connected to a test pad through DF signal line, and the input ends of these transmission gates also connected decoder of addressing circuit in the addressable test chip. As shown in FIG. 14, the input of the decoder is 10 bits, the output is 1024 bits, and the 1024 outputs of the decoder are connected to the 1024 transmission gates.

Figure 12:
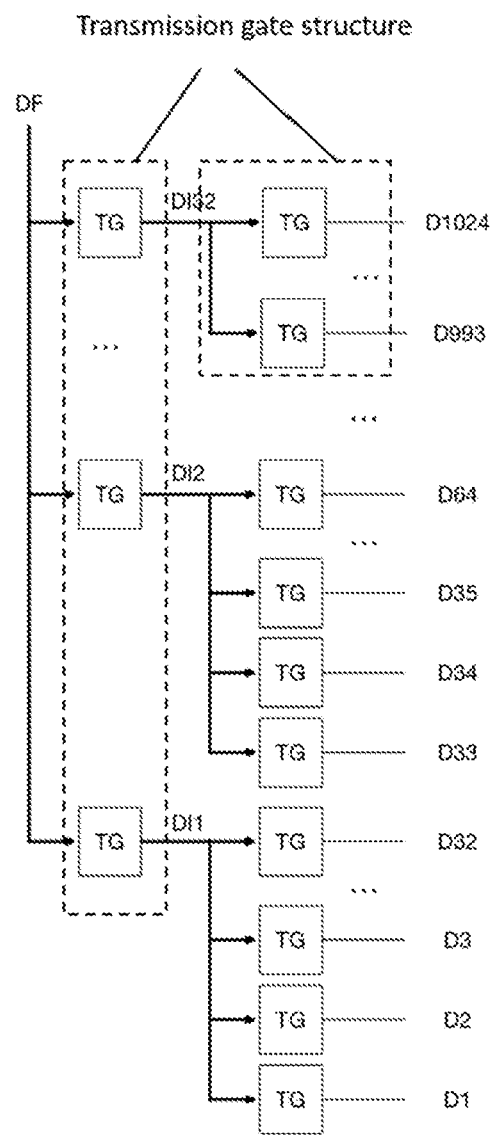
FIG. 12 illustrates the structure of two-stage transmission gate according to some embodiments.

The switching circuit is a two-stage transmission gate circuit which composed by transmission gate structures, as shown in FIG. 12. For 1024 DUTs, in the example, take DF test signal line as an example, the switching circuit includes one first-stage transmission gate structure and 32 last-stage transmission gate structures; each first-stage transmission gate structure includes 32 first-stage transmission gates, these 32 first-stage transmission gates are connected to DF test pad through signal lines; each last-stage transmission gate structure includes 32 last-stage transmission gates, these 32 last-stage transmission gates are connected to the same one of 32 first-stage transmission gates; the outputs of the last-stage transmission gates are connected to DUTs' ports. Therefore, at least two decoders are needed to control transmission gates of the two-stage transmission gate circuit in on-state or off-state.

Figure 13:
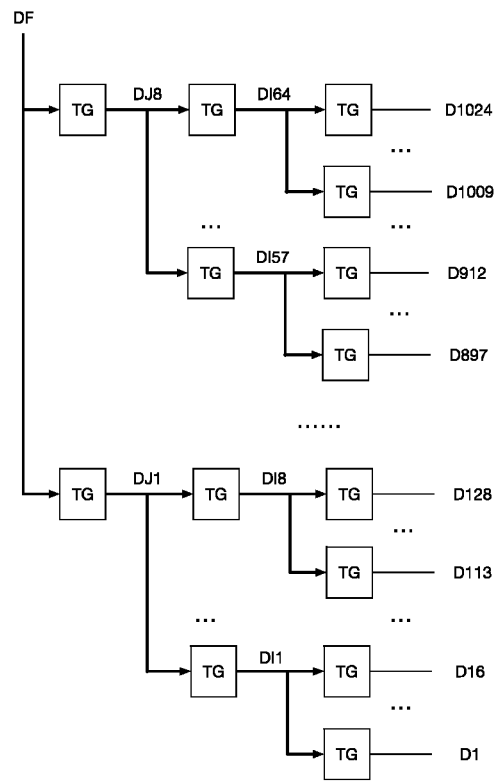
FIG. 13 illustrates the structure of three-stage transmission gate according to some embodiments.
Figure 15:
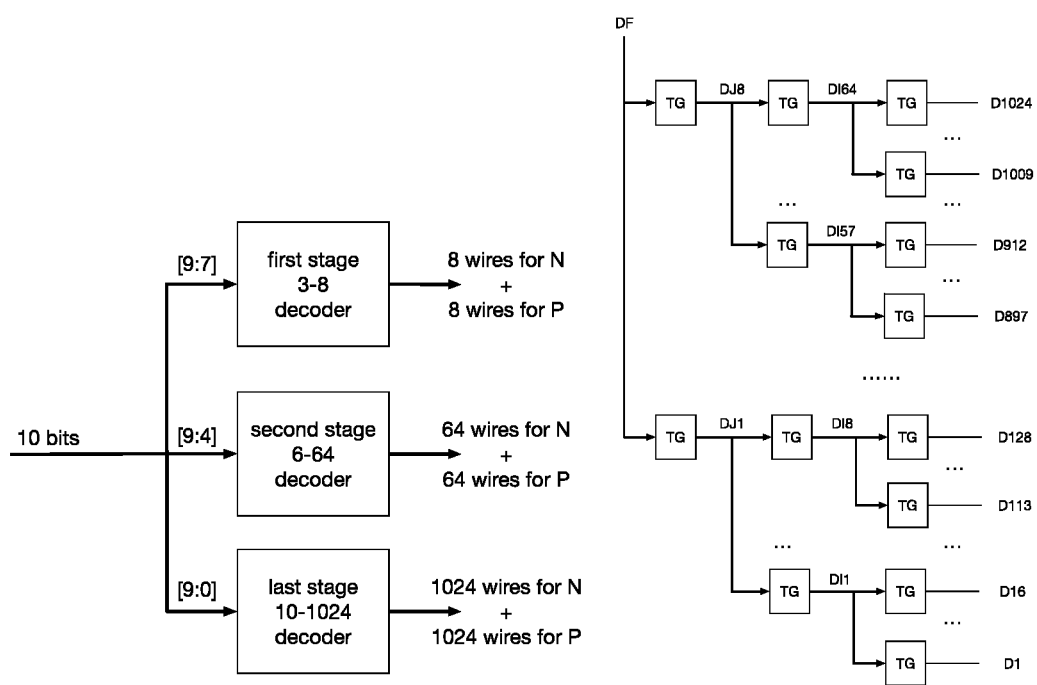
FIG. 15 illustrates the structure of three-stage transmission gate structures configured with decoders.

The switching circuit is composed by three-stage transmission gate circuit, as shown in FIG. 13. Take DF test signal line as an example, for 1024 DUTs, the switching circuit includes 1 first-stage transmission gate structures, 8 second-stage transmission gate structures and 64 last-stage transmission gate structures, each first-stage transmission gate structure includes 8 transmission gates, these 8 first-stage transmission gates are connected to DF test pad through signal lines; each second-stage transmission gate structure includes 8 transmission gates, each last-stage transmission gate structure includes 16 transmission gates; the outputs of the last-stage transmission gate structures are connected to DUTs' ports. Therefore, at least three decoders are needed to control transmission gates of the three-stage transmission gate circuit in on-state or off-state, as shown in FIG. 15: a 3-8 decoder, a 6-64 decoder and a 10-1024 decoder connected to the input of the first-stage, second-stage and last-stage transmission gates respectively.

When a DUT is selected to test, the background leakage current (Ibg) of the unselected DUTs can be estimated using the following formula: for one-stage transmission gate circuit, Ibg=1023×Ioff; for two-stage transmission gate circuit, Ibg=31×Ioff+31×Ioff; for three-stage transmission gate circuit, Ibg=7×Ioff+7×Ioff+15×Ioff, wherein, Ioff is the background leakage current of one transmission gate. It can be seen that, using multi-stage transmission gate structure to replace common switch or single transmission gate can decrease the background leakage current and improve the test precision of electrical parameters.

In some embodiments, the multi-stage transmission gate structures also can be used with other addressable circuits, such as the new type of addressable test chip with address register.

Figure 6B:
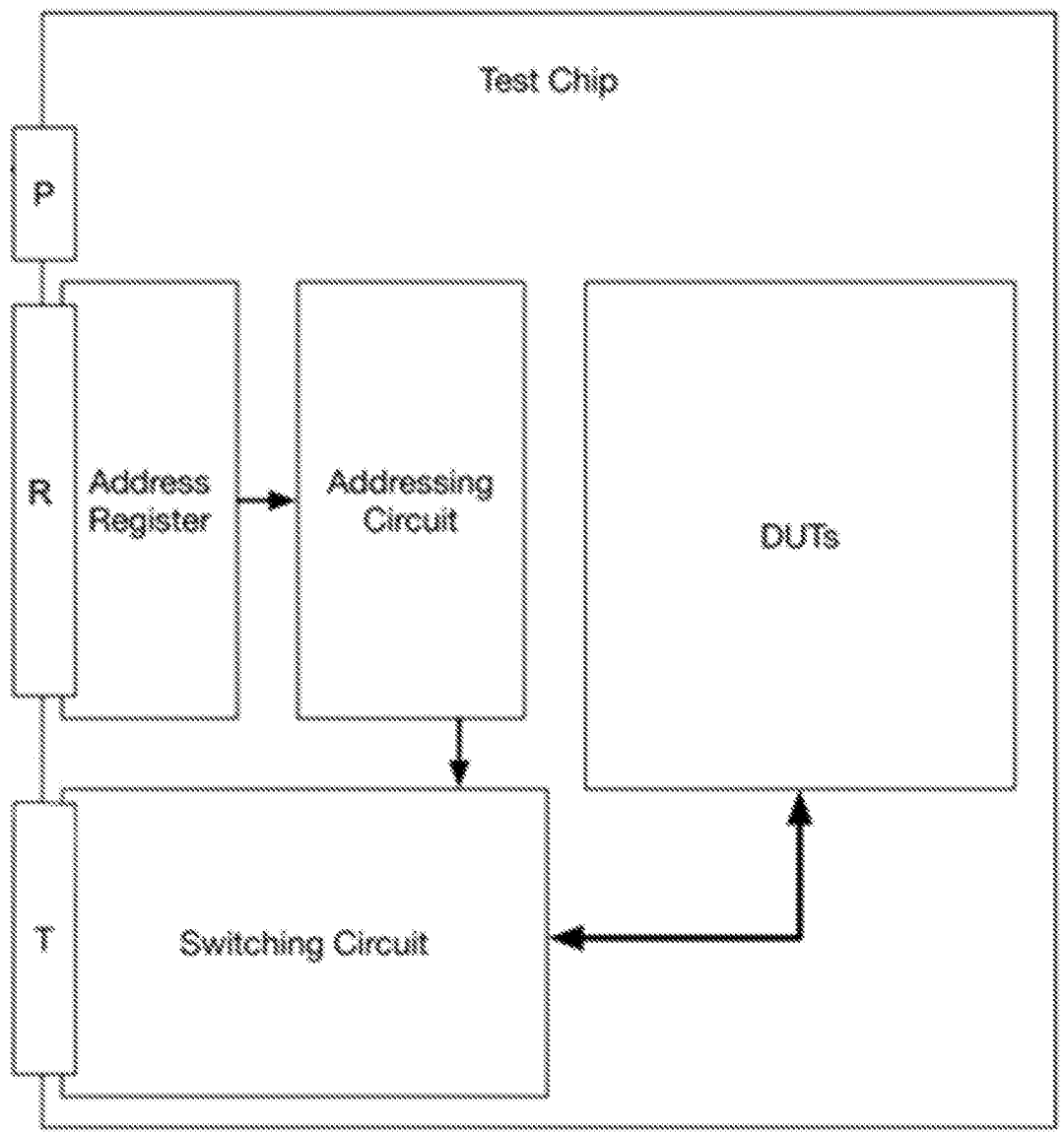
FIG. 6B illustrates a common addressable test chip integrated with address register.

The test chip using multi-stage transmission gate structures to replace common switch or single transmission gate can also be expressed by FIG. 6A and FIG. 6B, and the test chip can also be used as the disclosed test chip test system in the disclosure.

Example 4

The switching circuit as part of an addressable test chip, whether using common switches, transmission gates, or multi-stage transmission gate structures, the IR-drop of switching circuit cannot be ignored in some testing requirement, such as small resistance measurement. Especially for multi-stage transmission gate structures, more transmission gates may lead to larger IR-drop.

To decease the IR-drop in switching circuit, a new type of addressable test chip is disclosed in this example, a couple of forcing circuit and sensing circuit are configured to each DUT array in the addressable test chip. Common addressable test chip includes a plurality of pads, at least one addressing circuit, at least one switching circuit and DUTs; the DUTs can be divided into one or more DUT arrays, a couple of addressing circuit and switching circuit are configured to each DUT array; the addressing circuit includes a set of rows and columns addressing circuit; the switching circuit includes a set of rows and columns switching circuit.

The new type of addressable test chip is configured with at least one addressing circuit and at least two switching circuits; defining a forcing circuit includes an addressing circuit and a switching circuit; defining a sensing circuit includes an addressing circuit and a switching circuit; a DUT array is configured with a couple of forcing circuit and sensing circuit; for a couple of forcing circuit and sensing circuit, one addressing circuit can be shared by the two circuits.

Figure 3C:
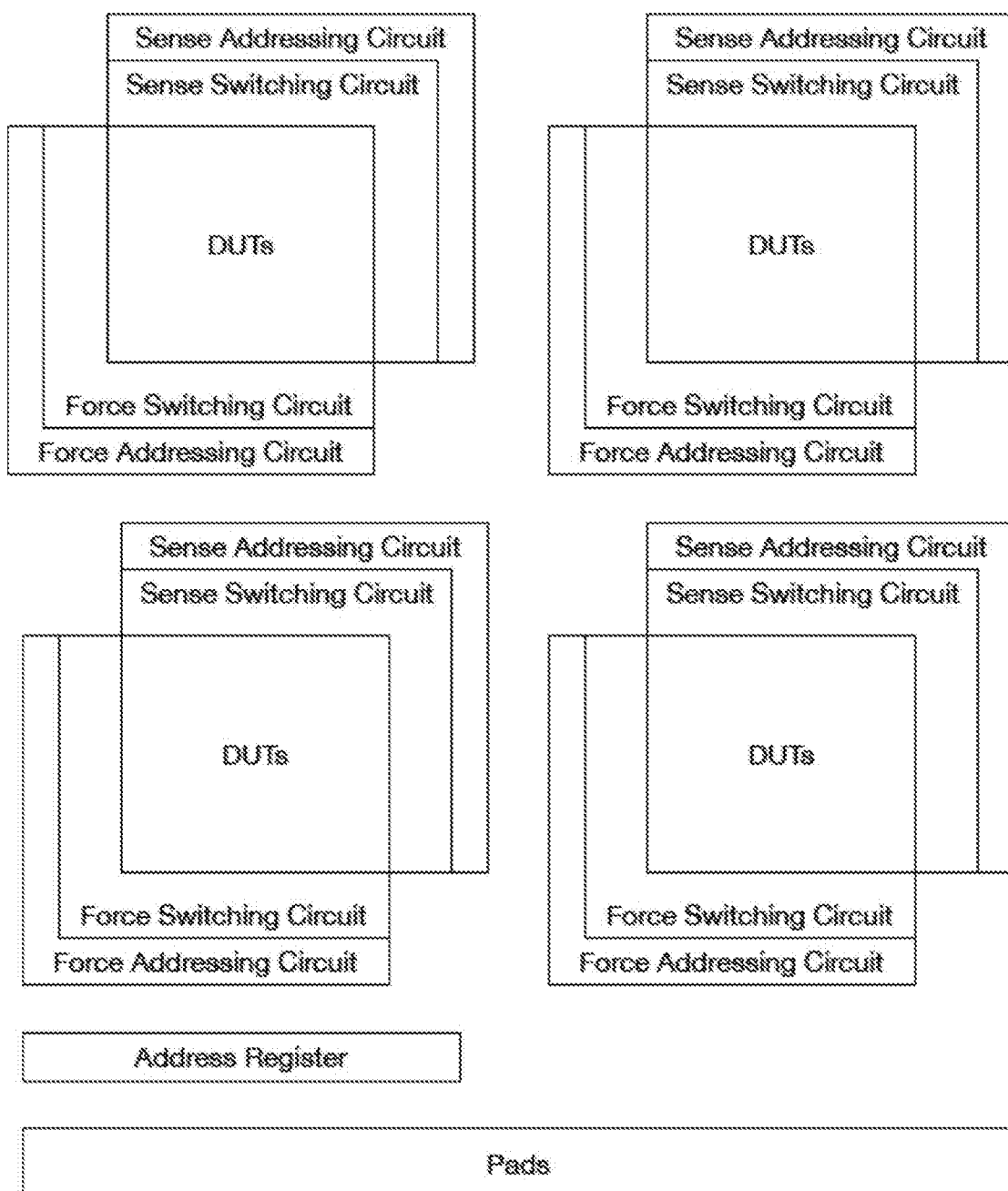
FIG. 3C illustrates a type of addressable test chip integrated with an address register and a sensing circuit.
Figure 4C:
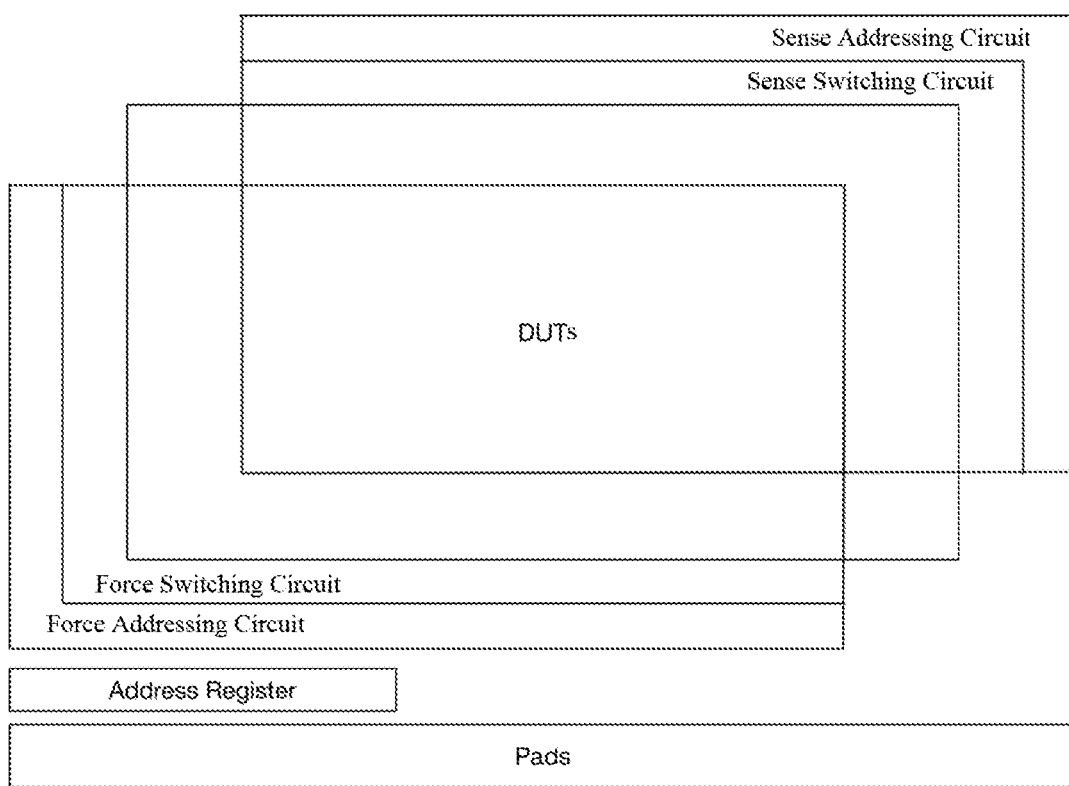
FIG. 4C illustrates a type of addressable test chip integrated with an address register and a sensing circuit.

As shown in FIG. 3C and FIG. 4C, the new type of addressable test chip includes a plurality of pads, at least one forcing circuit, at least one sensing circuit and DUTs. The DUTs can be divided into one or more DUT arrays, a couple of forcing circuit and sensing circuit are configured to each DUT array; each forcing circuit includes a force addressing circuit and a force switching circuit, each sensing circuit includes a sense addressing circuit and a sense switching circuit; for each DUT array, the force addressing circuit and sense addressing circuit connect to address signal pads and obtain address signal through the address signal pads, and also connect to the force switching circuit and sense switching circuit respectively, and output address select signals to control switches of the force switching circuit and sense switching circuit in on-state or off-state; the force and sense switching circuits connect to DUTs and select the same DUT to be tested through the state of switches. The force addressing circuit and sense addressing circuit also connect to the power pads and the power pads supply power for the whole test chip, the force and sense switching circuits also connect to test pads and the test pads supply test points for the whole test chip.

Figure 16:
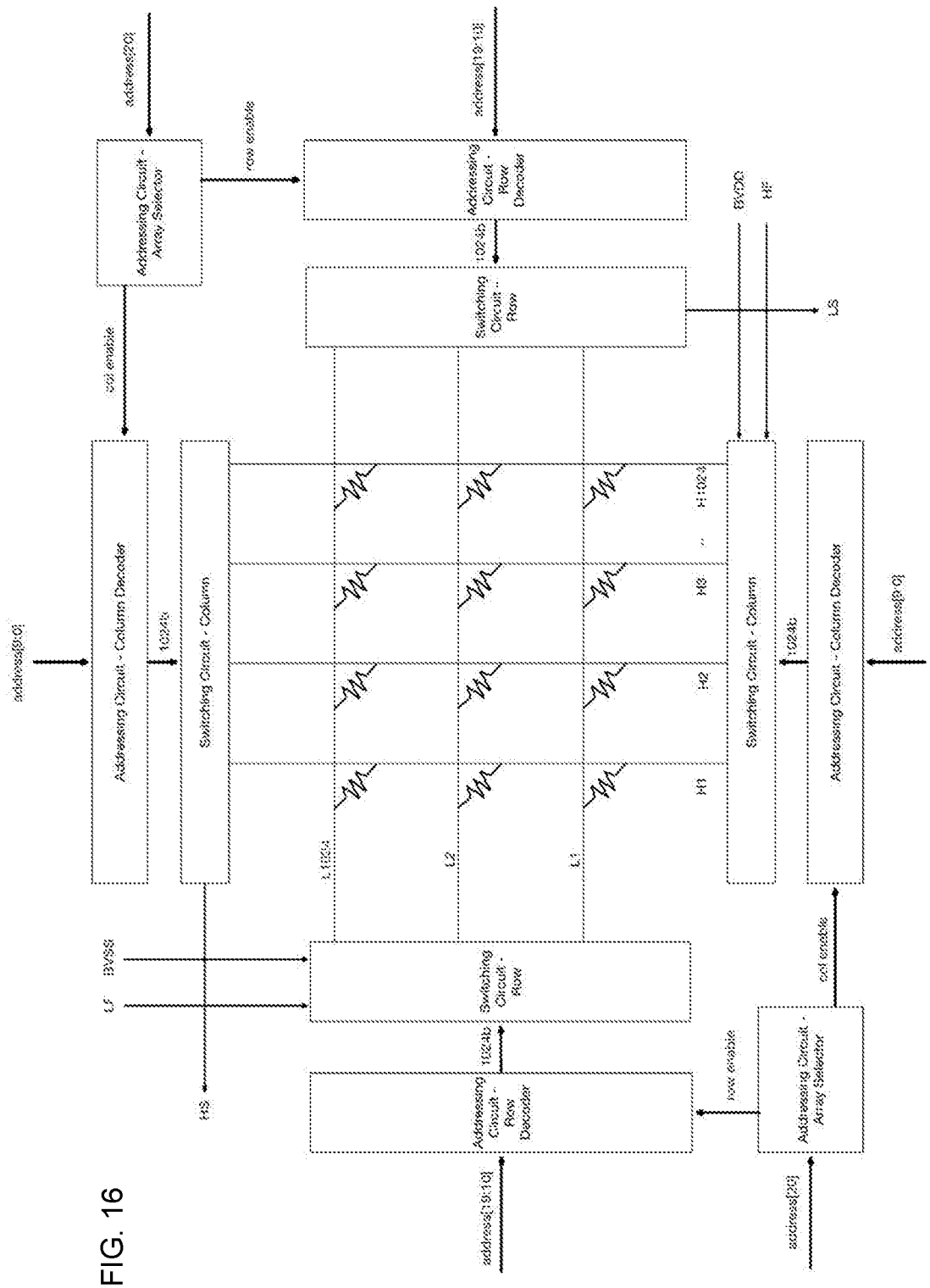
FIG. 16 illustrates a type of addressable test chip equipped with a sensing circuit.
Figure 17:
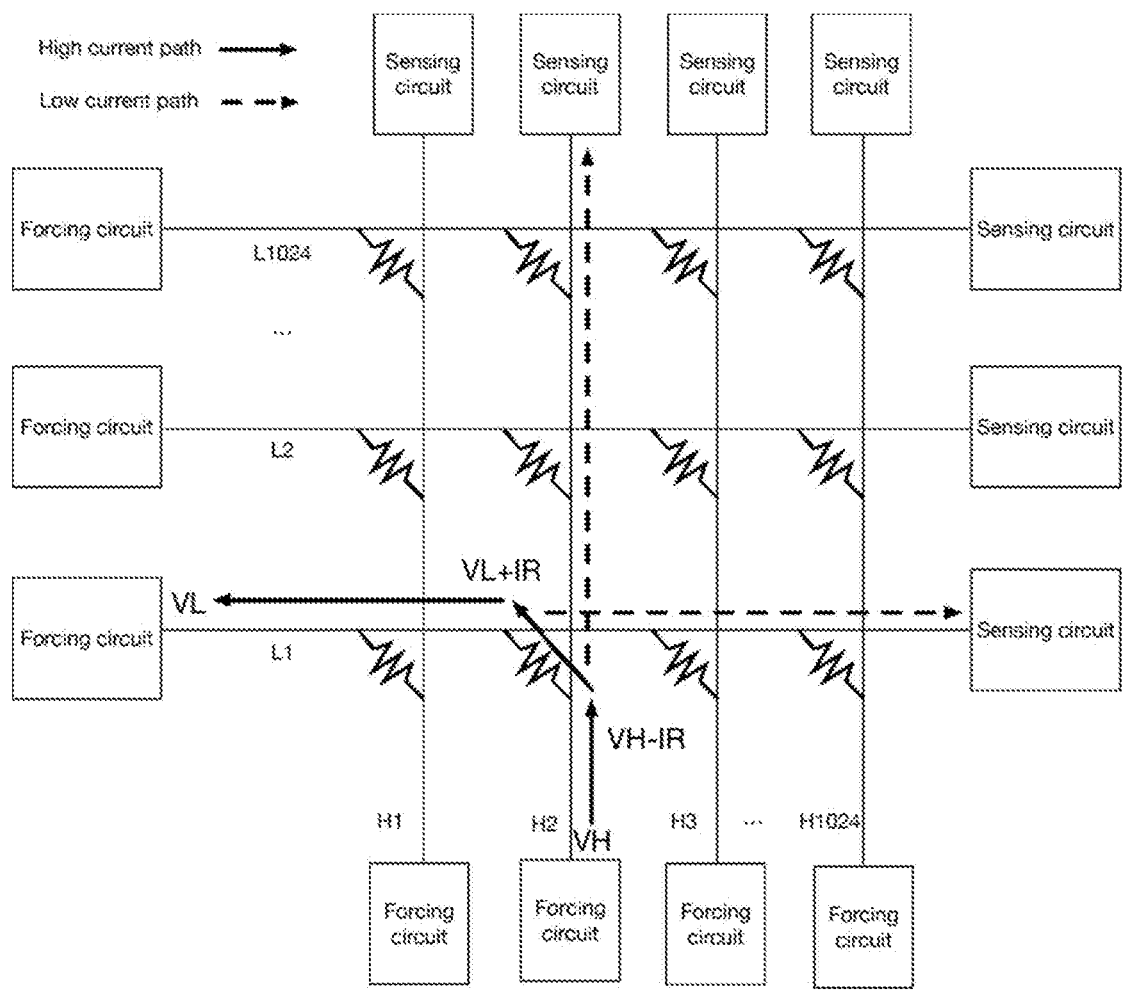
FIG. 17 illustrates a type of addressable test chip equipped with a sensing circuit.

In some examples, the forcing circuit and sensing circuit also can be configured in common addressable test chip and other kinds of addressable test chips to improve the accuracy of resistance measurements. In this example, as shown in FIG. 16 and FIG. 17, the forcing circuit and sensing circuit are configured to a common addressable test chip without an address register, in the two drawings, the DUT in the addressable test chip is resistor. For each DUT array, the force addressing circuit and sense addressing circuit connect to address signal pads and obtain address signal through the address signal pads, the two addressing circuits also respectively connect to the force switching circuit and sense switching circuit, and outputs address select signals to control switches of the force switching circuit and sense switching circuit in on-state or off-state; the force and sense switching circuits connect to DUTs and select a DUT to be tested through the switches' state. The force and sense addressing circuits also connect to the power pads and the power pads supply power for the whole test chip, the force and sense switching circuits also connect to test pads and the test pads supply test points for the whole test chip.

A new type of addressable test chip also suitable for the test equipment and the test system are disclosed in this disclosure. The addressable test chip can be regarded as having at least one forcing circuit and at least one sense circuit, in some examples, the structure of forcing and sensing circuits are the same.

Figure 18A:
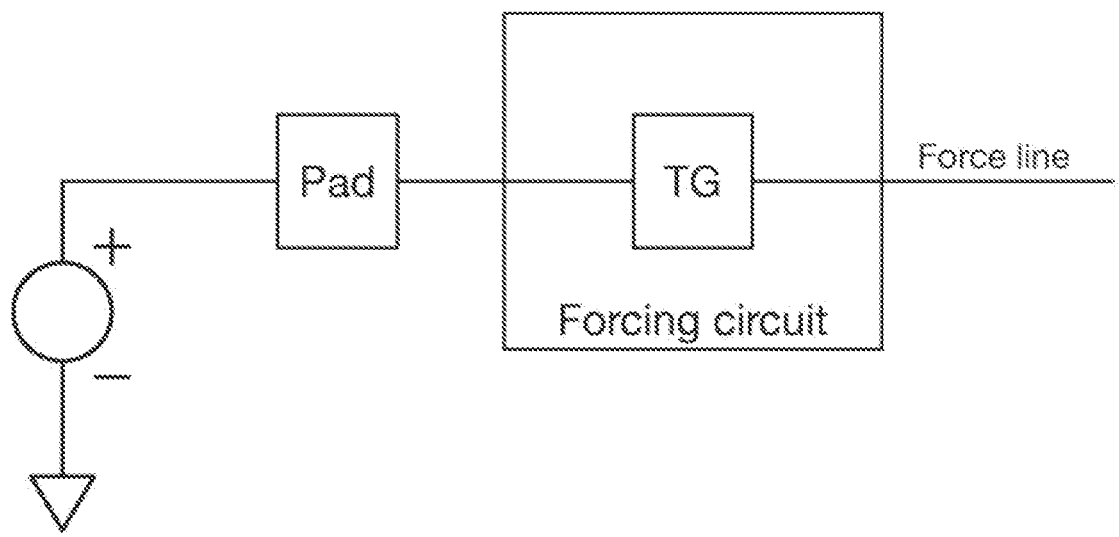
FIG. 18A illustrates a type of forcing circuit connected to a voltage source via a pad.
Figure 18B:
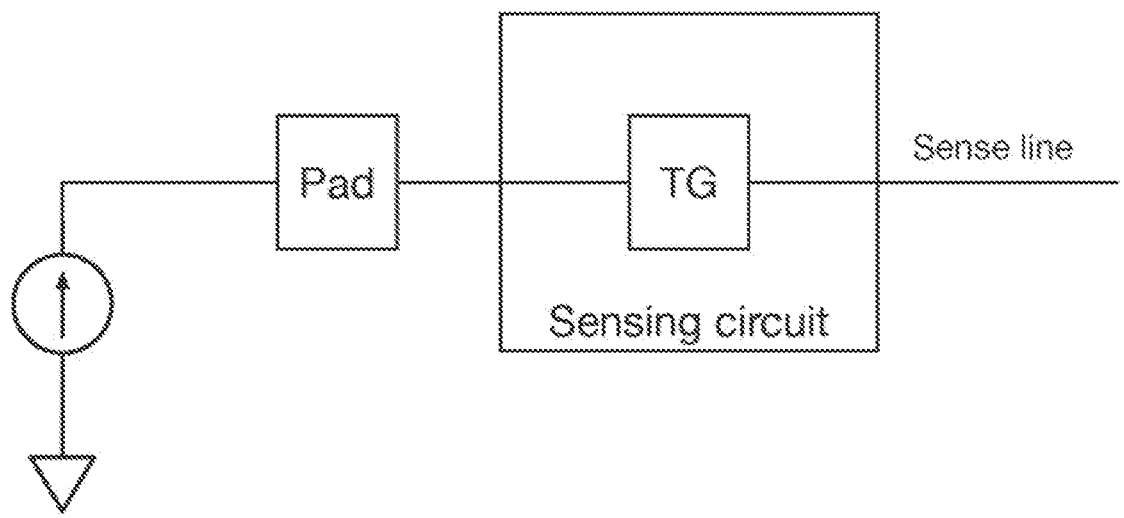
FIG. 18B illustrates a type of sensing circuit connected to a current source via a pad.

As shown in FIG. 18A and FIG. 18B, in the forcing circuit, the switching circuit (labeled as "TG" in FIG. 18A) connected to a voltage source via a pad, the voltage source supplies the desired voltage, due to IR-drop, the voltage on force line and the voltage source may be different; in the sensing circuit, the switching circuit (labeled as "TG" in FIG. 18B) connected to a current source via a pad, the current source supplies a small current, such as 10-12 A, the voltage sensed at the current source will be very close to the voltage on sense line because of very low current along the sense line, therefore, resistance of the selected DUT can be accurately measured.

In some examples, the sensing circuit also can be configured to common addressable test chip and other kinds of addressable test chips to improve the accuracy of resistance measurements.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A test apparatus for testing electrical parameters of a target chip, the apparatus comprising:
a function generator;
a switch matrix module;
a plurality of source measurement units (SMUs);
at least one of the SMUs is configured to provide power supply for the target chip;
at least one of the SMUs is coupled to the switch matrix module; and
at least two of said SMUs are test SMUs coupled to ports of the target chip and the function generator;
wherein the function generator is configured to generate clock pulse signals to stimulate an address register of the target chip to thereby select one or more device under tests (DUTs) to be tested; and
the at least two of said SMUs that are test SMUs are configured to receive the clock pulse signals to trigger the test apparatus to enter a test state and test the one or more DUTs upon selection, thereby improving test speed.

2. An addressable test chip test system including the test apparatus of claim 1, the system comprising:
a probe card;
an address register;
an addressable test chip; and
a test path coupling the addressable test chip with the test apparatus through the probe card;
wherein:
the addressable test chip includes a plurality of test pads, at least one addressing circuit(s), at least one switching circuit, and a plurality of DUTs;
the plurality of DUTs are divided into one or more DUT arrays, a pair of addressing circuit and switching circuit are configured to each DUT array;
said addressing circuit(s) are configured to obtain the address signals ADDR through the plurality of test pads, and output address select signals to control switches of the switching circuit in an on-state or an off-state;
said switching circuit(s) are configured to select one of the DUTs to be tested through the on-state or off-state of the switches; and
said address register is integrated in one of said probe card or the addressable test chip, configured to select test modes including sequential test mode and diagnostic test mode; and reduce pad area to accommodate high-density test chips with device density >1000/mm$^2$.

3. An addressable test chip test system including a test apparatus for testing electrical parameters of a target chip, the test apparatus comprising:
a function generator;
a switch matrix module;
a plurality of source measurement units (SMUs);
at least one of the SMUs is configured to provide power supply for the target chip;
at least one of the SMUs is coupled to the switch matrix module; and
at least two of said SMUs are test SMUs coupled to ports of the target chip and the function generator;
the system comprising:
a probe card;
an address register;
an addressable test chip; and
a test path coupling the addressable test chip with the test apparatus through the probe card;
wherein:
the addressable test chip includes a plurality of test pads, at least one addressing circuit(s), at least one switching circuit, and a plurality of devices under test (DUTs);
the DUTs are divided into one or more DUT arrays, a pair of addressing circuit and switching circuit are configured to each DUT array;
said addressing circuit(s) are configured to obtain the address signals ADDR through the plurality of test pads, and output address select signals to control switches of the switching circuit in an on-state or an off-state;
said switching circuit(s) are configured to select one of the DUTs to be tested through the on-state or off-state of the switches; and
said address register is integrated in one of said probe card or the addressable test chip,
wherein the address register comprises:
a plurality of edge-triggered flip-flop registers;
at least one counter logic;
at least one shifter logic;
a multiplexer;
input ports including a reset signal RST, a clock signal CLK, a shift enable signal SE, a shift data input signal SI;
an output port including an address signal ADDR;
an output of the at least one counter logic;
an output of the at least one shifter logic;
wherein:
an input D of the plurality of edge-triggered flip-flop registers is coupled to a data output of the multiplexer;
an input R of the plurality of edge-triggered flip-flop registers is coupled to a reset (RST) pad of the address register;
an input CK of the plurality of edge-triggered flip-flop registers is coupled to a clock (CLK) pad of the address register;
an output Q of the plurality of edge-triggered flip-flop registers is coupled to an address (ADDR) pad of the address register;
an input of the counter logic is coupled to the address (ADDR) pad of the address register;
an input of the shifter logic is coupled to the address (ADDR) pad and the shift data input signal SI; and an input of the multiplexer is coupled to the shift enable signal SE, the output of the counter logic, and the output of the shifter logic.

4. The system of claim 3, wherein the shift enable signal SE controls the multiplexer, a signal chooses one device to work between the counter logic and the shifter logic: when SE=1, the shifter logic in the address register is selected, and the address register has the same function of a shift register; when SE=0, the counter logic in the address register is selected, and the address register has the same function of a counter.

5. The system of claim 3, wherein the address register further comprises a scan data output signal (SO) output port, which outputs the lowest bit of the address signal ADDR which is used to check whether DUT is the one we want to test.

6. The system of claim 2, wherein:
the addressable test chip includes a plurality of pads, at least one forcing circuit, at least one sensing circuit and a plurality of DUTs;
defining a forcing circuit includes an addressing circuit and a switching circuit;
defining a sensing circuit includes an addressing circuit and a switching circuit;
each DUT array is configured with a couple of forcing circuit and sensing circuit, one addressing circuit can be shared by the two circuits;
for each DUT array, the force addressing circuit and sense addressing circuit connect to address signal pads and obtain address signal to control switches of the force switching circuit and sense switching circuit in on-state or off-state; and
the force and sense switching circuits are configured to select one of the DUTs to be tested through the on-state or off-state of the switches.

7. The system of claim 2, wherein the switching circuit of the addressable test chip is a multi-stage transmission gate circuit which composed by transmission gate structures; each stage of the circuit includes at least one transmission gate structure; each transmission gate structure includes at least one transmission gate; the output end of each high-level transmission gate connected to low-level transmission gate(s)' input ends of a low-level transmission gate structure, the output ends of the lowest level transmission gates connected to terminals of DUTs, the input ends of the highest level transmission gate connected to test pads; the input end of each transmission gate also connected to the decoder in the addressing circuit.

8. The system of claim 7, wherein each same-level transmission gate connected to the same number of low-level transmission gates.

9. The system of claim 7, wherein the input ends of the same-level transmission gate structures connected to the same decoder.

10. An addressable test chip test system including a test apparatus for testing electrical parameters of a target chip, the test apparatus comprising:
a function generator;
a switch matrix module;
a plurality of source measurement units (SMUs);
at least one of the SMUs is configured to provide power supply for the target chip;
at least one of the SMUs is coupled to the switch matrix module; and
at least two of said SMUs are test SMUs coupled to ports of the target chip and the function generator;

the system comprising:
a probe card;
an address register;
an addressable test chip; and
a test path coupling the addressable test chip with the test apparatus through the probe card;
wherein:
the addressable test chip includes a plurality of test pads, at least one addressing circuit(s), at least one switching circuit, and a plurality of devices under test (DUTs);
the DUTs are divided into one or more DUT arrays, a pair of addressing circuit and switching circuit are configured to each DUT array;
said addressing circuit(s) are configured to obtain the address signals ADDR through the plurality of test pads, and output address select signals to control switches of the switching circuit in an on-state or an off-state;
said switching circuit(s) are configured to select one of the DUTs to be tested through the on-state or off-state of the switches; and
said address register is integrated in one of said probe card or the addressable test chip,
wherein:
the test apparatus comprises: the function generator, the switch matrix module, said plurality of source measurement units (SMUs) and the database;
at least one of said SMUs is configured to provide power supply for the target chip;
at least one of said SMUs is connected to the switch matrix module;
at least one of said SMUs is used to connect the address register;
at least two of said SMUs are test SMUs, and said test SMUs are connected to the ports of each of the plurality of DUTs, and said test SMUs are connected to the function generator; and
the database is used to store the test results.

11. The system of claim 10, wherein:
the test system comprises the test apparatus, the probe card and the addressable test chip, the test apparatus connected to the addressable test chip through the probe card to constitute a test path: the address registers are connected to the addressing circuit(s) in the addressable test chip;
at least one of said SMUs in the test apparatus is connected to the test pads in the addressable test chip through the probe card, at least one of said SMUs is connected to the switch matrix module, the switch matrix module is connected to the address register, and one of said SMUs is connected to the switch matrix module wherein said switch matrix module provides the shift enable signal SE and the shift data input signal SI for the address register through the switch matrix module;
at least one of said SMUs is connected to the address register through the probe card to provide a reset signal RST for the address register;
the function generator is connected to the address register through the probe card to provide a clock signal CLK for the address register; at least two of said SMUs are test SMUs, and said test SMUs are connected to said switching circuit(s) of the addressable test chip through the probe card; and
the function generator is connected to said test SMUs.

12. The system of claim 11, wherein:

each of the plurality of SMUs in the test apparatus is coupled to the probe card through the switch matrix module;

when the address register is integrated in the probe card, the connect relationships of the addressable test chip test system as follows: at least one SMU connected to the power pads through the probe card, to provide power for the addressable test chip; at least one SMU connected to the switch matrix module, and the switch matrix module connected to the input pads SE and SI of the address register in the probe card; the output of the address signal from the address register connected to the address signal pads of the addressable test chip; at least one SMU connected to the address register through the reset signal RST; the function generator connected to the address register through the clock signal CLK; at least two SMUs are test SMUs, and these test SMUs connected to the test pads of the test chip through the probe card; the function generator also connected to the test SMUs; the database in the test apparatus is used to store the test results; and the address register is integrated in the addressable test chip constitutes a new type of addressable test chip: the input end of the address register connected to address register pads in the test chip; the output end of the addressing circuit connected to the first port of the switching circuit, the second and third port of the switching circuit connected to DUTs and test pads through signal lines; the address register outputs address signals, these address signals are decoded by the addressing circuit as address select signals, these address select signals control switching circuit to select DUT to be test.

13. The system of claim 11, wherein, a plurality of buffers are configured to the addressing circuits to solve the problem of too long metal wiring connection and signal integrity.

14. The system of claim 11, wherein, a plurality of buffers are configured in one of the test apparatus and the probe card of the test system, and the function generator not being connected directly with the test SMUs, but is connected to the test SMUs through one of the plurality of buffers.

15. The system of claim 11, wherein each of the plurality of SMUs is configured to the test apparatus: when the parallel testing is needed, the plurality of DUTs are selected and tested simultaneously, one of test results output terminal is configured to one of the plurality of SMUs.

16. The system of claim 11, wherein:

the system is configured to execute a test method including: before the test system is tested, the test apparatus is configured to connect with the probe card;

in response to a test requirement, the test apparatus controls the probe card to connect with the addressable test chip;

the function generator generates clock pulse signals, the clock pulse signal stimulates the address register to generate the address signals, the address signals are decoded to the address select signals through said addressing circuit(s) in the addressable test chip, the address select signal controls said switching circuit(s) to select a DUT to be tested, at the same time, the clock pulse signal generated by the function generator is output into the test SMUs in the test apparatus to trigger the test apparatus to enter a test state;

the test apparatus tests the selected DUT immediately when the DUT is selected; and said test results are stored in the database.

17. The system of claim 11, wherein:

based on the function of the address register, when the shift enable signal SE=1, the addressable test chip test system executes address configuration mode as follows:

A1, power on the test system;

A2, configure the SMUs and the function generator;

A3, set the reset signal RST=1 and maintain more than 100 µs, then turn the reset signal RST=0;

A4, set the shift enable signal SE=1, the addressable test chip entries an address configuration mode;

A5, the variable i is assigned to the address data bit N, the shift data input signal SI is assigned to the i-th of the address data bit;

A6, maintain more than 10 us;

A7, the function generator produces a complete pulse; and

A8, the variable i is assigned to i−1; if i=0, end the address configuration, otherwise, go back to step A5.

18. The system of claim 17, wherein the system is configured to, based on the function of the address register, keep the shift enable signal SE=1, the addressable test chip test system executes sequential test mode as follows:

B1, configure the SMUs and the function generator;

B2, set the address range of the OUTs from StartADDR to EndADDR, the number of the DUT is N, M measurement items need to be tested for each of said OUTs, and each of a plurality of measurement items corresponds to a different voltage/current combination of the signal line ports of DUT; B3, each of said plurality of measurement items of the M measurement items is labeled as Mi (i is an integer from 1 to M), execute steps from B5 to B 11;

B4 set the address data as StarAddr;

B5, execute steps from A4 to AB, complete the address configuration for sequential test mode;

B6, set SE=0;

B7, set the function generator to produce a continuous pulse (square wave), and set a needed frequency and set the number of pulses to N;

B8, start the function generator, during each pulse time, the addressable test chip completes an address transformation, one of the test SMUs will complete a test, and the test results are stored into test SMUs momentarily;

B9, every SamplePerFetch pulses, reads the test results from one of the test SMUs, fetches and stores the data into the database;

B10, finish the test until all the N pulses are generated, and each of the plurality of test results are stored in the database and are analyzed by the online analysis engine to identify outliers; and wherein, StartADDR, EndADDR and SamplePerFetch are integers, and EndADDR≥StartADDR.

19. The system of claim 17, wherein the system is configured to, based on the function of the address register, keep the shift enable signal SE=1, the addressable test chip test system executes diagnostic test mode as follows:

C1, configure each of the SMUs and the function generator;

C2, set the address, named ADDR, of the DUT to be diagnosed;

C3, set the address data as ADDR;

C4, execute steps from A4 to A8, complete the address configuration;

C5, set SE=0;

C6, adjust the voltages/currents on the test pads, and measure accordingly for diagnosis; and C7, go back to step C3 if another DUT needs to be diagnosed.

20. The system of claim 11, wherein when the address register is integrated in the addressable test chip, the connect relationships of the addressable test chip test system is as follows:

at least one of said SMUs connected to the test pads through the probe card, to provide power for the test chip;

at least one of said SMUs is connected to the switch matrix module, and the switch matrix module connected to input pads SE and SI of the address register through the probe card;

at least one of said SMUs is connected to an RST pad of the address register in the test chip through the probe card; the function generator is connected to a CLK pad of the multipurpose register through the probe card;

each of the test SMUs are connected to the test pads in the addressable test chip through the probe card, so as to provide voltage and realize data test for the test chip;

the function generator is connected to one of the test SMUs; and the database in the test apparatus is used to store the test results.

* * * * *